(12) United States Patent
Sato et al.

(10) Patent No.: US 12,176,374 B2
(45) Date of Patent: Dec. 24, 2024

(54) IMAGING DEVICE COMPRISING ISOLATION REGION BETWEEN FLOATING DIFFUSION AND ANOTHER IMPURITY REGION

(71) Applicant: Panasonic Intellectual Property Management Co., Ltd., Osaka (JP)

(72) Inventors: Yoshihiro Sato, Osaka (JP); Yoshinori Takami, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 686 days.

(21) Appl. No.: 17/322,960

(22) Filed: May 18, 2021

(65) Prior Publication Data

US 2021/0273011 A1    Sep. 2, 2021

Related U.S. Application Data

(63) Continuation of application No. PCT/JP2020/001201, filed on Jan. 16, 2020.

(30) Foreign Application Priority Data

Feb. 22, 2019 (JP) .................................. 2019-030766

(51) Int. Cl.
  *H01L 27/146*  (2006.01)

(52) U.S. Cl.
  CPC .. *H01L 27/14643* (2013.01); *H01L 27/14603* (2013.01); *H01L 27/14609* (2013.01); *H01L 27/14636* (2013.01)

(58) Field of Classification Search
  CPC ......... H01L 27/14643; H01L 27/14665; H01L 27/146; H01L 27/14601–14609; H01L 27/14636; H01L 27/14641; H01L 27/1463
  See application file for complete search history.

(56) References Cited

U.S. PATENT DOCUMENTS

| | | |
|---|---|---|
| 2014/0043510 A1 | 2/2014 | Kasuga et al. |
| 2014/0103400 A1 | 4/2014 | Sakata et al. |
| | (Continued) | |

FOREIGN PATENT DOCUMENTS

| | | |
|---|---|---|
| JP | 62-016565 | 1/1987 |
| JP | 2016-063216 | 4/2016 |
| | (Continued) | |

OTHER PUBLICATIONS

International Search Report of PCT application No. PCT/JP2020/001201 dated Apr. 7, 2020.

*Primary Examiner* — Steven M Christopher
*Assistant Examiner* — Tyler J Wiegand
(74) *Attorney, Agent, or Firm* — Rimon P.C.

(57) ABSTRACT

An imaging device includes a semiconductor substrate, a photoelectric converter that converts incident light into a charge, a first impurity region located in the semiconductor substrate, where the first impurity region accumulates the charge and contains impurities of a first conductivity type, a second impurity region located in the semiconductor substrate, where the second impurity region contains impurities of the first conductivity type and is different from the first impurity region, a third impurity region located in the semiconductor substrate, between the first impurity region and the second impurity region in plan view, where the third impurity region contains impurities of a second conductivity type that differs from the first conductivity type, and a first contact located on the semiconductor substrate and electrically connected to the third impurity region. The first contact includes a semiconductor containing impurities of the second conductivity type.

19 Claims, 16 Drawing Sheets

(56) References Cited

U.S. PATENT DOCUMENTS

| | | | |
|---|---|---|---|
| 2015/0076500 | A1 | 3/2015 | Sakaida et al. |
| 2015/0109503 | A1 | 4/2015 | Mori et al. |
| 2016/0079297 | A1 | 3/2016 | Sato et al. |
| 2016/0211292 | A1* | 7/2016 | Shimizu ............ H01L 27/14643 |
| 2017/0250216 | A1* | 8/2017 | Sato .................. H01L 27/14603 |
| 2019/0027524 | A1 | 1/2019 | Sato et al. |

FOREIGN PATENT DOCUMENTS

| | | |
|---|---|---|
| JP | 2016-127058 | 7/2016 |
| JP | 2019-024075 | 2/2019 |
| WO | 2012/147302 | 11/2012 |
| WO | 2012/176390 | 12/2012 |
| WO | 2013/190759 | 12/2013 |
| WO | 2014/002330 | 1/2014 |

\* cited by examiner

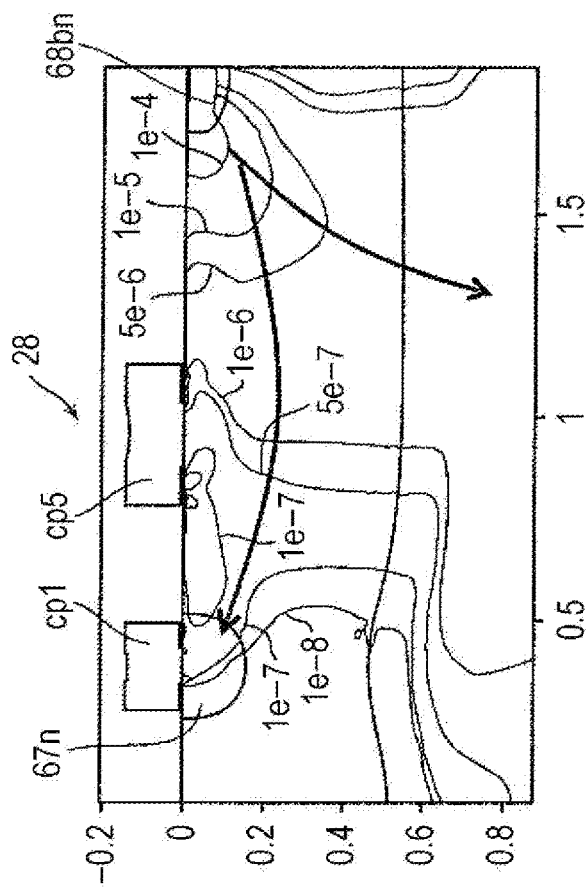
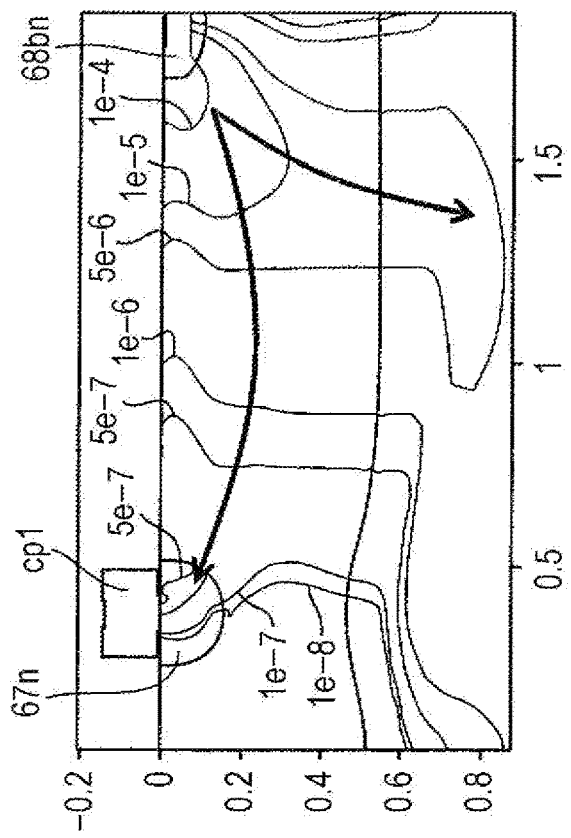

IMAGING DEVICE COMPRISING ISOLATION REGION BETWEEN FLOATING DIFFUSION AND ANOTHER IMPURITY REGION

BACKGROUND

1. Technical Field

The present disclosure relates to an imaging device.

2. Description of the Related Art

Charge coupled device (CCD) image sensors and complementary metal oxide semiconductor (CMOS) image sensors are widely used in, for example, digital cameras. As is well known, these image sensors have a photodiode formed on a semiconductor substrate.

In addition, a structure in which a photoelectric converter having a photoelectric conversion layer is disposed above a semiconductor substrate is described in, for example, International Publication Nos. 2014/002330 and 2012/147302. An imaging device having such a structure is also referred to as a stacked imaging device. In a stacked imaging device, the charge generated through photoelectric conversion is stored in a charge accumulation region (referred to as a "floating diffusion"). A signal corresponding to the amount of charge accumulated in the charge accumulation region is read out via a CCD or CMOS circuit formed on a semiconductor substrate.

SUMMARY

One non-limiting and exemplary embodiment provides an imaging device described below.

In one general aspect, the techniques disclosed here feature an imaging device. The imaging device includes a semiconductor substrate, a photoelectric converter that converts incident light into a charge, a first impurity region located in the semiconductor substrate, a second impurity region located in the semiconductor substrate, a third impurity region located in the semiconductor substrate, and a first contact located on the semiconductor substrate. The first impurity region accumulates the charge and contains impurities of a first conductivity type. The second impurity region contains impurities of the first conductivity type and is different from the first impurity region. The third impurity region is located between the first impurity region and the second impurity region in plan view. The third impurity region contains impurities of a second conductivity type that differs from the first conductivity type. The first contact is electrically connected to the third impurity region. The first contact includes a semiconductor containing impurities of the second conductivity type.

It should be noted that general or specific embodiments may be implemented as an element, a device, a module, a system, a method, or any selective combination thereof.

Additional benefits and advantages of the disclosed embodiments will become apparent from the specification and drawings. The benefits and/or advantages may be individually obtained by the various embodiments or features of the specification and drawings, which need not all be provided in order to obtain one or more of such benefits and/or advantages.

BRIEF DESCRIPTION OF THE DRAWINGS

FIGS. 6A and 6B illustrate a comparison of the electron current distribution in the cross section of a semiconductor substrate close to the blocking structure according to the first embodiment and that according to a reference example;

DETAILED DESCRIPTION

Figure 1:
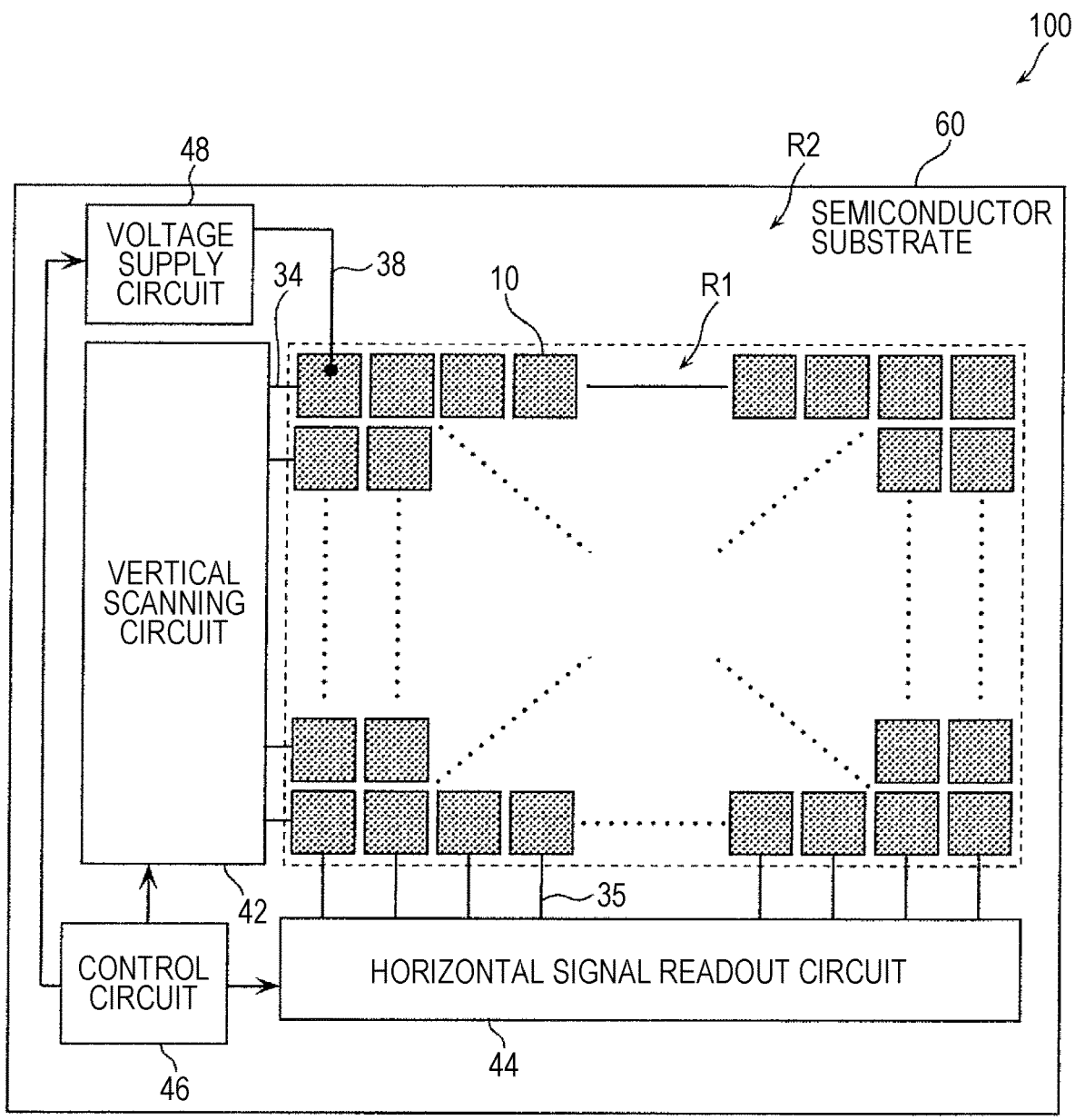
FIG. 1 illustrates an exemplary configuration of an imaging device according to a first embodiment of the present disclosure.

If a charge different from a signal charge that represents an image flows into the diffusion region that temporarily holds the signal charge, noise may be generated. Noise degrades the quality of the resulting image. It is beneficial to prevent the unintended movement of a charge. Hereinafter, such unintended movement of a charge is also referred to as "leakage current".

Overview of Present Disclosure

The overview of one aspect of the present disclosure is described below.

According to one aspect of the present disclosure, an imaging device includes a semiconductor substrate, a photoelectric converter that converts incident light into a charge, a first impurity region located in the semiconductor substrate, a second impurity region located in the semiconductor substrate, a third impurity region located in the semiconductor substrate, and a first contact located on the semiconductor substrate. The first impurity region accumulates the charge and contains impurities of a first conductivity type. The second impurity region contains impurities of the first conductivity type and is different from the first impurity region. The third impurity region is located between the first impurity region and the second impurity region in plan view. The third impurity region contains impurities of a second conductivity type that differs from the first conductivity type. The first contact is electrically connected to the third impurity region. The first contact includes a semiconductor containing impurities of the second conductivity type.

Consequently, even if minority carriers attempt to move by diffusion from the second impurity region to the first impurity region, their movement is blocked by a potential barrier formed by the third impurity region formed immediately below the first contact. In addition, the minority carriers disappear by recombination with charges of opposite polarity. That is, the movement of the minority carriers into the first impurity region is blocked by the third impurity region. As a result, leakage current due to mixing of the minority carriers into the first impurity region is reduced.

At this time, the impurity concentration of the second conductivity type in the first contact may be higher than the impurity concentration of the second conductivity type in a portion of the third impurity region located below a surface of the semiconductor substrate.

In this manner, the impurity concentration of the surface of the semiconductor substrate in the third impurity region can be increased. As a result, the leakage current can be more reliably reduced by the third impurity region.

In addition, the imaging device may further include a voltage supply circuit that supplies a voltage to the first contact and a well region that is located in the semiconductor substrate and that contains impurities of the second conductivity type. The first impurity region, the second impurity region, and the third impurity region may be located in the well region.

As a result, the voltage supplied to the first contact is applied to the well region via the third impurity region. For this reason, the first contact can be used as a substrate contact.

In addition, the imaging device may further include a first pixel. The first pixel may include the first impurity region, the second impurity region, the third impurity region, and the first contact.

In addition, the imaging device may further include a first pixel and a second pixel that differs from the first pixel. The first pixel may include the first impurity region, and the second pixel may include the second impurity region.

In this manner, the third impurity region is located between pixels. For this reason, leakage current due to mixing of minority carriers between pixels is reduced.

Furthermore, the imaging device may further include a first pixel and a second pixel that differs from the first pixel. The first pixel may include the first impurity region, the second impurity region, the third impurity region, and the first contact. The second pixel may include a fourth impurity region, a fifth impurity region, and a second contact. The fourth impurity region may be located in the semiconductor substrate and may contain impurities of the first conductivity type. The fifth impurity region may be located in the semiconductor substrate, between the first impurity region and the fourth impurity region in plan view, and the fifth impurity region may contain impurities of the second conductivity type. The second contact may be located on the semiconductor substrate and may be electrically connected to the fifth impurity region, and the second contact may include a semiconductor containing impurities of the second conductivity type.

In this manner, the second contact and the fifth impurity region similar to the first contact and third impurity region, respectively, are formed at the boundary of two neighboring pixels. As a result, the leakage current flowing not only within a pixel but also between pixels is reduced. In the imaging device according to one aspect of the present disclosure, the first impurity region need not be electrically connected to the second impurity region. The imaging device according to one aspect of the present disclosure may further include a transistor having the second impurity region as one of a source and a drain of the transistor, and the transistor may detect a signal in accordance with the potential of the first impurity region. In the imaging device according to one aspect of the present disclosure, the transistor may include a gate electrode electrically connected to the first impurity region. In the imaging device according to one aspect of the present disclosure, the third impurity region may be in contact with a surface of the semiconductor substrate.

According to another aspect of the present disclosure, an imaging device includes a semiconductor substrate, a photoelectric converter that converts incident light into a charge, a first impurity region located in the semiconductor substrate, a second impurity region located in the semiconductor substrate, a sixth impurity region located in the semiconductor substrate, a third contact located on the semiconductor substrate, and a seventh impurity region located in the semiconductor substrate. The first impurity region accumulates the charge and contains impurities of a first conductivity type. The second impurity region contains impurities of the first conductivity type and is different from the first impurity region. The sixth impurity region is located between the first impurity region and the second impurity region in plan view. The sixth impurity region contains impurities of the first conductivity type. The third contact is electrically connected to the sixth impurity region and includes a semiconductor containing impurities of the first conductivity type. The seventh impurity region is located between the first impurity region and the sixth impurity region in plan view and between the second impurity region and the sixth impurity region in plan view. The seventh impurity region contains impurities of a second conductivity type that differs from the first conductivity type.

As a result, even if minority carriers attempt to move by diffusion from the second impurity region to the first impurity region, their movement is blocked by a potential barrier of the sixth impurity region formed immediately below the third contact. In addition, since the seventh impurity region is provided as an element isolation region, the minority carriers disappear by recombination with charges of opposite polarity. That is, the movement of the minority carriers to the first impurity region is blocked by the third impurity region and the seventh impurity region. As a result, leakage current due to mixing of the minority carriers into the first impurity region is reduced.

At this time, the impurity concentration of the first conductivity type in the third contact may be higher than the impurity concentration of the first conductivity type in a portion of the sixth impurity region located below a surface of the semiconductor substrate.

In this manner, the impurity concentration of the surface of the semiconductor substrate in the sixth impurity region can be increased. As a result, the leakage current can be more reliably reduced by the sixth impurity region.

In addition, the imaging device may further include a voltage supply circuit that supplies a voltage to the third contact and a well region that is located in the semiconductor substrate and that contains impurities of the second conductivity type. The first impurity region, the second impurity region, the sixth impurity region, and the seventh impurity region may be located in the well region.

In this manner, the voltage supplied to the third contact is applied to the well region via the sixth impurity region. Thus, the third contact can be used as a substrate contact.

In addition, the imaging device may further include a first pixel and a second pixel that differs from the first pixel. The first pixel may include the first impurity region, and the second pixel may include the second impurity region.

As a result, the sixth impurity region is located between pixels. Thus, the leakage current due to mixing of minority carriers between pixels is reduced.

The imaging device may further include a first pixel and a second pixel that differs from the first pixel. The first pixel may include the first impurity region, the second impurity region, the sixth impurity region, the seventh impurity region, and the third contact. The second pixel may include a fourth impurity region, an eighth impurity region, a fourth contact, and a ninth impurity region. The fourth impurity region may be located in the semiconductor substrate and may contain impurities of the first conductivity type. The eighth impurity region may be located in the semiconductor substrate, between the first impurity region and the fourth impurity region in plan view, and the eighth impurity region may contain impurities of the first conductivity type. The fourth contact may be located on the semiconductor substrate and may be electrically connected to the eighth impurity region, and the fourth contact may include a semiconductor containing impurities of the first conductivity type. The ninth impurity region may be located in the semiconductor substrate, between the first impurity region and the eighth impurity region in plan view and between the fourth impurity region and the eighth impurity region in plan view, and the ninth impurity region may contain impurities of the second conductivity type.

In this manner, the fourth contact and the eighth impurity region similar to the third contact and the sixth impurity region, respectively, are formed at the boundary between two neighboring pixels. As a result, the leakage current flowing not only within a pixel but also between pixels is reduced.

The imaging device may further include a first region that is located in the semiconductor substrate and that contains impurities of the second conductivity type and a second region that covers an entire surface of the first region and that contains impurities of the first conductivity type. The well region may be located above the second region.

In this manner, the second region that contains impurities of the first conductivity type is provided so as to cover the entire surface of the first region containing impurities of the second conductivity type. Thus, inflow of minority carriers from the first region or a peripheral circuit is blocked. In the imaging device according to another aspect of the present disclosure, the first impurity region need not be electrically connected to the second impurity region. The imaging device according to another aspect of the present disclosure may further include a transistor having the second impurity region as one of a source and a drain of the transistor, and the transistor may detect a signal in accordance with the potential of the first impurity region. In the imaging device according to another aspect of the present disclosure, the transistor may include a gate electrode electrically connected to the first impurity region. In the imaging device according to another aspect of the present disclosure, the sixth impurity region may be in contact with a surface of the semiconductor substrate.

The embodiments of the present disclosure are described in detail below with reference to the accompanying drawings. Note that each of the embodiments described below is a general or specific example of the present disclosure. A value, a shape, a material, a constituent element, the positions and the connection form of the constituent elements, steps, and the sequence of steps described in the embodiments are only examples and shall not be construed as limiting the scope of the present disclosure. In addition, the variety of aspects described herein may be combined in any way, as long as no contradiction occurs. Furthermore, among the constituent elements in the embodiments described below, the constituent element that does not appear in an independent claim, which has the broadest scope, is described as an optional constituent element. In the following description, the constituent elements having substantially the same function are identified by the same reference numeral, and description of the constituent element is not repeated in some cases. Furthermore, for simplicity, some of the elements may be removed from the drawings.

Note that the variety of elements illustrated in the drawings are schematic for the purpose of understanding the present disclosure and not necessarily to scale. In addition, the external appearance of the element may differ from the actual one. That is, all the figures are schematic in nature and are not exact illustrations. Accordingly, for example, the scale may vary between figures.

As used herein, the terms describing the positional relationship between elements, such as "parallel" or "same", terms describing the shape of an element, such as "circular" or "rectangular", and numerical ranges are not used in a strict sense but used in a broader sense (in a substantially equivalent range, for example, with a tolerance of several %).

In addition, as used herein, the terms "upper" and "lower" do not refer to an upper direction (vertically upper) and a lower direction (vertically lower) in absolute spatial recognition, but are each used as a term that is defined by a relative positional relationship based on the order in which a layer is stacked in a stacked structure. More specifically, the term "upper" is used to refer to the side from which the light is coming to the imaging device, and the term "lower" is used to refer to the opposite side. Similarly, the terms "upper surface" and "lower surface" of a member are used to describe a surface facing the light coming to the imaging device and a surface opposite to the surface facing the light, respectively. Note that the terms "upper", "lower", "upper surface" and "lower surface" are used only to specify the mutual arrangement of the members and are not intended to limit the posture of the imaging device during use. In addition, the terms "upper" and "lower" are applied not only to the case where two constituent elements are disposed with a spacing therebetween and another constituent element is disposed between the two constituent elements, but also the case where two constituent elements are disposed so as to be in tight contact with each other. Furthermore, as used herein, the term "plan view" will be understood to be a view taken in a direction perpendicular to the semiconductor substrate.

First Embodiment

FIG. 1 illustrates an exemplary configuration of an imaging device 100 according to a first embodiment of the present disclosure. The imaging device 100 illustrated in FIG. 1 includes a plurality of pixels 10 and peripheral circuits formed on a semiconductor substrate 60.

In an example illustrated in FIG. 1, the pixels 10 are arranged in a plurality of rows and columns in a matrix with m rows and n columns, where m and n are integers of one or greater and are independent from each other. For example, the pixels 10 are two-dimensionally arranged on the semiconductor substrate 60 to form an imaging region R1.

The number of pixels 10 and the arrangement of the pixels 10 are not limited to those in the example illustrated in FIG. 1. For example, the number of pixels 10 included in the imaging device 100 may be one. In this example, the center of each pixel 10 is located on a lattice point of a square lattice. However, the plurality of pixels 10 may be arranged such that the center of each of the pixels 10 is located on a lattice point of, for example, a triangular lattice or a hexagonal lattice. For example, if the pixels 10 are arranged in a one-dimensional manner, the imaging device 100 can be used as a line sensor.

In the configuration illustrated in FIG. 1, the peripheral circuits include a vertical scanning circuit 42 and a horizontal signal readout circuit 44. As illustrated in FIG. 1, the peripheral circuits may further include a control circuit 46 and a voltage supply circuit 48. The peripheral circuits may further include a signal processing circuit and an output circuit, and the like. In the example illustrated in FIG. 1, each of the peripheral circuits is provided on the semiconductor substrate 60. However, a subset of the peripheral circuits may be disposed on a substrate other than the semiconductor substrate 60 having the pixels 10 formed thereon.

The vertical scanning circuit 42 (also referred to as a row scanning circuit) is connected to the address signal lines 34 each provided for one of the rows of the pixels 10. As described below, a signal line provided for each rows of the pixels 10 is not limited to the address signal line 34. A plurality of types of signal lines can be connected to the vertical scanning circuit 42 for a plurality of rows of the pixels 10. The horizontal signal readout circuit 44 (also referred to as a column scanning circuit) is connected to a vertical signal line 35 provided for each of the rows of the pixels 10.

The control circuit 46 receives, for example, command data and clocks provided from the outside of the imaging device 100 and performs overall control of the imaging device 100. Typically, the control circuit 46 includes a timing generator and supplies drive signals to the vertical scanning circuit 42, the horizontal signal readout circuit 44, the voltage supply circuit 48, and the like. In FIG. 1, arrows extending from the control circuit 46 schematically represent the flow of output signals provided from the control circuit 46. The control circuit 46 can be achieved by, for example, a microcontroller including one or more processors. The functions of the control circuit 46 may be achieved by a combination of a general-purpose processing circuit and software or by hardware dedicated to the processing.

The voltage supply circuit 48 supplies a predetermined voltage to each of the pixels 10 via a voltage line 38. The voltage supply circuit 48 is not limited to a particular power supply circuit, but may be a circuit that converts a voltage supplied from a power source, such as a battery, into a predetermined voltage, or a circuit that generates a predetermined voltage. Alternatively, the voltage supply circuit 48 may be a part of the vertical scanning circuit 42 described above. As illustrated schematically in FIG. 1, these circuits that constitute the peripheral circuits are disposed in a peripheral region R2 outside the imaging region R1.

Figure 2:
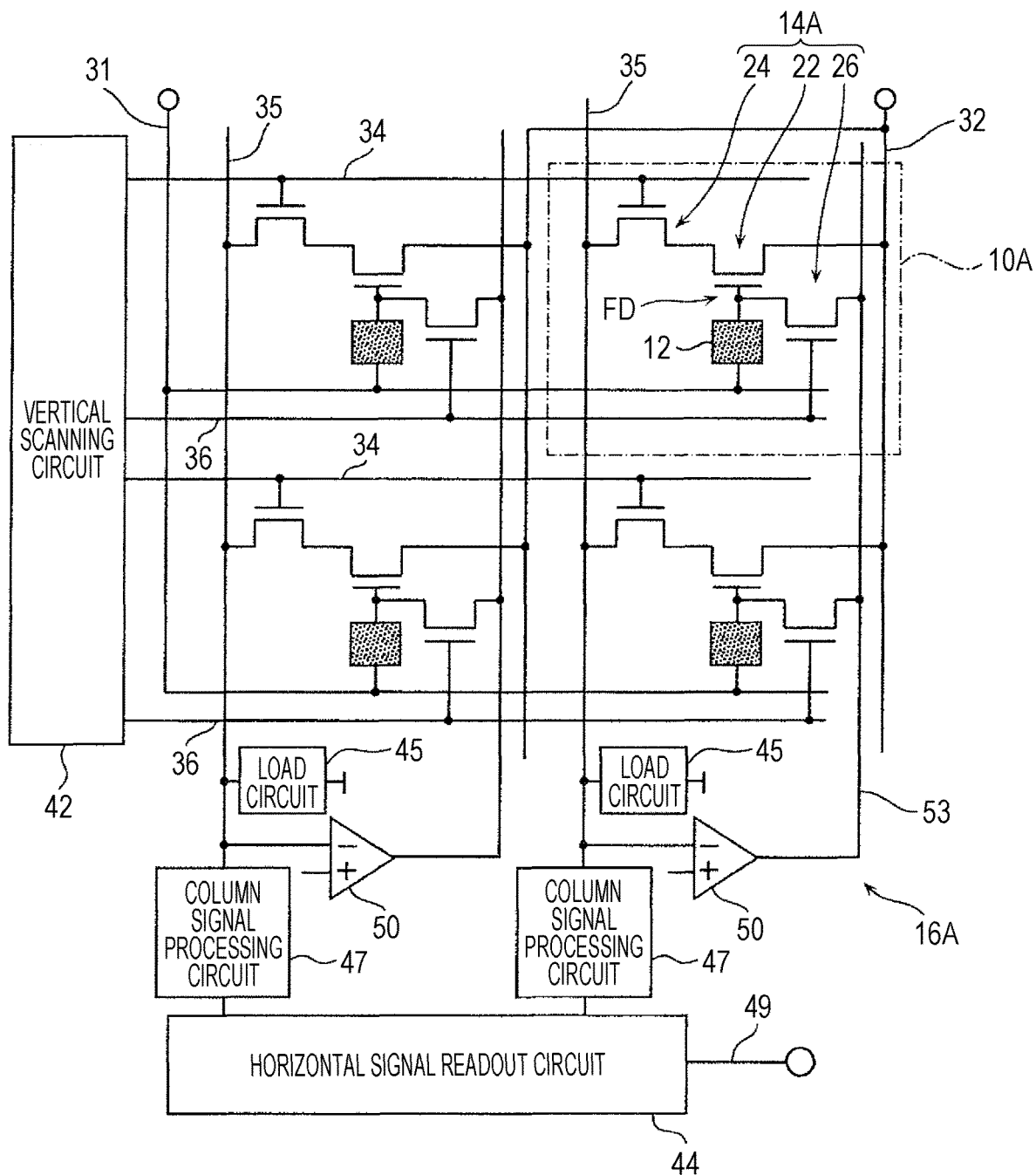
FIG. 2 illustrates an exemplary circuit configuration of the imaging device according to the first embodiment of the present disclosure.

FIG. 2 schematically illustrates an exemplary circuit configuration of the imaging device 100 according to the first embodiment of the present disclosure. For simplicity, in FIG. 2, four pixels 10A arranged in two rows and two columns are illustrated as an illustrative example. Each of the pixels 10A is an example of the pixel 10 illustrated in FIG. 1 and has a photoelectric conversion structure 12 serving as a photoelectric converter. The pixel 10A further includes a signal detection circuit 14A electrically connected to the photoelectric conversion structure 12. As described in detail below with reference to the accompanying drawings, the photoelectric conversion structure 12 includes a photoelectric conversion layer disposed above the semiconductor substrate 60. That is, in the present embodiment, a stacked imaging device is described as the imaging device 100.

Upon receiving incoming light, the photoelectric conversion structure 12 generates positive and negative charges, typically, hole-electron pairs. The photoelectric conversion structure 12 can be a photoelectric conversion structure including a photoelectric conversion layer disposed above the semiconductor substrate 60 or a photodiode formed on the semiconductor substrate 60. Note that in FIG. 2, the photoelectric conversion structures 12 of the pixels 10A are spatially separated from each other. However, this is only for convenience of description, and the photoelectric conversion structures 12 of the plurality of pixels 10A can be disposed continuously on the semiconductor substrate 60 without spacing therebetween. When each of the pixels 10A has, for example, a photoelectric conversion structure above the semiconductor substrate 60 as the photoelectric conversion structure 12, the imaging region R1 illustrated in FIG. 1 can be defined as a region of the semiconductor substrate 60 that is covered by the photoelectric conversion structure.

The photoelectric conversion structure 12 of each of the pixels 10A has a connection with an accumulation control line 31. During operation of the imaging device 100, a predetermined voltage is applied to the accumulation control line 31. For example, if among the positive and negative charges generated through the photoelectric conversion, the positive charge is to be used as a signal charge, a positive voltage of, for example, about 10V can be applied to the accumulation control line 31 during operation of the imaging device 100. As an example, the case in which holes are used as signal charges is described below.

In the configuration illustrated in FIG. 2, the signal detection circuit 14A includes a signal detection transistor 22, an address transistor 24, and a reset transistor 26. As described in detail below with reference to the accompanying drawings, the signal detection transistor 22, the address transistor 24, and the reset transistor 26 are typically field-effect transistors (FETs) that are formed on the semiconductor substrate 60 and that support the photoelectric conversion structure 12. Hereinafter, an example is described in which an N-channel MOSFET (Metal Oxide Semiconductor FET) is used as a transistor, unless expressly specified otherwise. Note that the polarity of the FET and the current level of the potential determine which of two diffusion layers of the FET corresponds to the source or drain. Consequently, which diffusion layer is the source or drain may depend on the operating state of the FET.

As illustrated schematically in FIG. 2, the gate of the signal detection transistor 22 is electrically connected to the photoelectric conversion structure 12. By applying a predetermined voltage to the accumulation control line 31 during operation, holes, for example, can be accumulated in a charge accumulation node FD as signal charges. Herein, the charge accumulation node FD is a node to connect the gate of the signal detection transistor 22 to the photoelectric conversion structure 12. As described below with reference to the accompanying drawings, the charge accumulation node FD has, as part thereof, an impurity region formed in the semiconductor substrate 60. In the illustrated example, the charge accumulation node FD has a function of temporarily holding the charge generated by the photoelectric conversion structure 12.

The drain of the signal detection transistor 22 is connected to a power supply line 32 that supplies a power supply voltage VDD of, for example, about 3.3V to each of the pixels 10A during operation of the imaging device 100. In addition, the source is connected to the vertical signal line 35 via the address transistor 24. The signal detection transistor 22 receives the supplied power supply voltage VDD to its drain and outputs a signal voltage corresponding to the amount of signal charge accumulated in the charge accumulation node FD.

The address signal line 34 is connected to the gate of the address transistor 24, which is connected between the signal detection transistor 22 and the vertical signal line 35. In this manner, the vertical scanning circuit 42 can read out the output of the signal detection transistor 22 of the selected pixel 10A to the corresponding vertical signal line 35 by applying, to the address signal line 34, a row selection signal that controls the on and off of the address transistor 24. Note that the location of the address transistor 24 is not limited to that in the example illustrated in FIG. 2. The address transistor 24 may be located between the drain of the signal detection transistor 22 and the power supply line 32.

A load circuit 45 and a column signal processing circuit 47 are connected to each of the vertical signal lines 35. The load circuit 45 forms a source follower circuit together with the signal detection transistor 22. The column signal processing circuit 47 is also referred to as a row signal accumulation circuit. The column signal processing circuit 47 performs noise reduction signal processing, represented by correlated double sampling, and analog-to-digital conversion. The horizontal signal readout circuit 44 sequentially reads out signals from the plurality of column signal processing circuits 47 to the horizontal common signal line 49. The load circuit 45 and the column signal processing circuit 47 can be one of the peripheral circuits described above.

A reset signal line 36 having a connection to the vertical scanning circuit 42 is connected to the gate of the reset transistor 26. Like the address signal line 34, the reset signal line 36 is provided for each of the rows of the pixels 10A. The vertical scanning circuit 42 can select, on a row basis, the pixels 10A to be reset by applying the row selection signal to the address signal line 34. In addition, the vertical scanning circuit 42 can switch on the reset transistor 26 of the selected row by applying a reset signal to the gate of the reset transistor 26 via the reset signal line 36. When the reset transistor 26 is switched on, the potential of the charge accumulation node FD is reset.

In this example, one of the drain and source of the reset transistor 26 is connected to the charge accumulation node FD, and the other is connected to a corresponding one of feedback lines 53 provided for each of the columns of the pixels 10A. That is, in this example, the voltage of the feedback line 53 is supplied to the charge accumulation node FD as a reset voltage that initializes the charge of the photoelectric conversion structure 12.

In the configuration illustrated in FIG. 2, the imaging device 100 includes a feedback circuit 16A that includes an inverting amplifier 50 as part of the feedback path. As illustrated in FIG. 2, the inverting amplifier 50 is provided for each of the columns of the pixels 10A. The feedback line 53 described above is connected to an output terminal of a corresponding one of the plurality of inverting amplifiers 50. The inverting amplifier 50 can be one of the peripheral circuits described above.

As illustrated in FIG. 2, an inverting input terminal of the inverting amplifier 50 is connected to the vertical signal line 35 of the corresponding column. A reference voltage Vref, which is a positive voltage of, for example, 1 V or about 1 V, is supplied to a non-inverting input terminal of the inverting amplifier 50 during operation of the imaging device 100. By switching on the address transistor 24 and the reset transistor 26, a feedback path can be formed to negatively feedback the output of the pixel 10A. The formation of the feedback path causes the voltage of the vertical signal line 35 to converge to the input voltage Vref input to the non-inverting input terminal of the inverting amplifier 50. That is, the formation of the feedback path resets the voltage of the charge accumulation node FD to a voltage such that the voltage of the vertical signal line 35 becomes Vref. As the voltage Vref, any level of voltage within the range between the supply voltage and the ground can be used. The formation of a feedback path can reduce the reset noise generated when the reset transistor 26 is switched off. A reduction of the reset noise by using feedback is described in detail in International Publication No. 2012/147302.

Device Configuration of Pixel

Figure 3A:
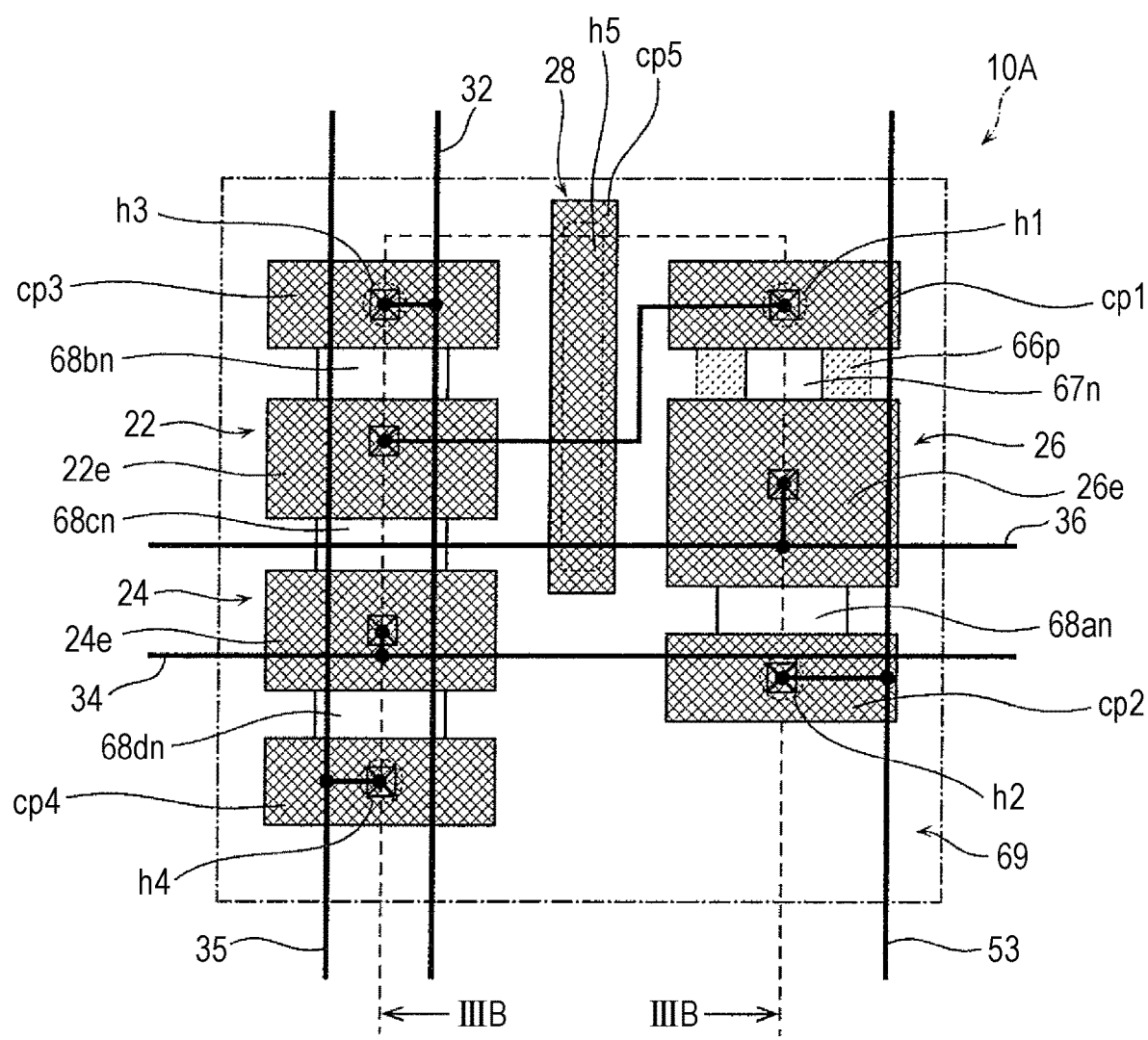
FIG. 3A is a plan view illustrating an example of the layout of elements in a pixel according to the first embodiment of the present disclosure.
Figure 3B:
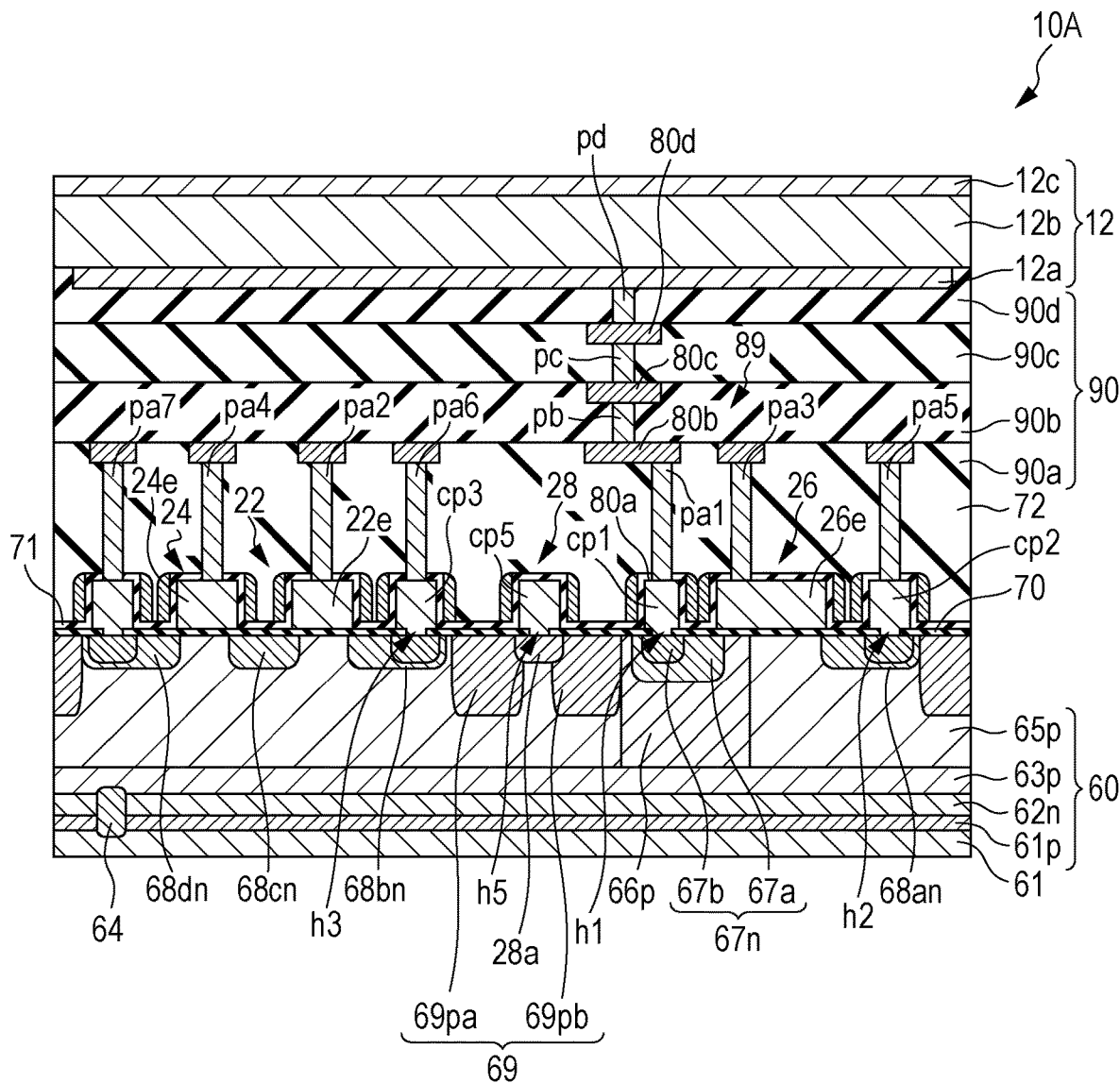
FIG. 3B is a schematic cross-sectional view illustrating an exemplary configuration of the pixel according to the first embodiment of the present disclosure.

FIG. 3A illustrates an example of the layout of elements of the pixel 10A. FIG. 3B schematically illustrates an example of the device structure of the pixel 10A. FIG. 3A schematically illustrates the arrangement of the elements formed on the semiconductor substrate 60 when the pixels 10A illustrated in FIG. 3B are viewed in the normal direction of the semiconductor substrate 60. If the pixel 10A is cut along a dashed line IIIB-IIIB of FIG. 3A and is developed, the cross-section illustrated in FIG. 3B is obtained.

As illustrated in FIG. 3B, the pixel 10A includes the semiconductor substrate 60, the photoelectric conversion structure 12 disposed above the semiconductor substrate 60, and a conductive structure 89. As can be seen from FIG. 3B, the photoelectric conversion structure 12 is supported by an interlayer insulating layer 90 that covers the semiconductor substrate 60, and the conductive structure 89 is disposed inside the interlayer insulating layer 90. In the example illustrated in FIG. 3B, the interlayer insulating layer 90 includes a plurality of insulating layers, and the conductive structure 89 includes a portion of each of the plurality of wiring layers disposed within the interlayer insulating layer 90. The plurality of wiring layers disposed in the interlayer insulating layer 90 can include wiring layers having, for example, the address signal line 34 and the reset signal line 36 as a part thereof and wiring layers having, for example, the vertical signal line 35, the power supply line 32, and the feedback line 53 as a part thereof. It is appreciated that the number of insulating layers and the number of wiring layers in the interlayer insulating layer 90 are not limited to those in the example. Any number of insulating layers and wiring layers may be employed.

The photoelectric conversion structure 12 is an example of a photoelectric converter that converts incident light into an electric charge. The photoelectric conversion structure 12 includes a pixel electrode 12a formed on the interlayer insulating layer 90, a counter electrode 12c disposed on the light incident side, and a photoelectric conversion layer 12b disposed between these electrodes. The photoelectric conversion layer 12b of the photoelectric conversion structure 12 is made of an organic material or an inorganic material, such as amorphous silicon, and generates positive and negative charges through photoelectric conversion upon receiving incident light via the counter electrode 12c. The photoelectric conversion layer 12b is typically formed continuously over a plurality of pixels 10A. The photoelectric conversion layer 12b may include a layer made of an organic material and a layer made of an inorganic material.

The counter electrode 12c is a translucent electrode made of a transparent conductive material, such as ITO. As used herein, the term "translucent" means that the photoelectric conversion layer 12b transmits at least part of light of a wavelength range that can be absorbed by the photoelectric conversion layer 12b, and it is not required that the light be transmitted over the entire wavelength range of visible light. Typically, like the photoelectric conversion layer 12b, the counter electrode 12c is formed over a plurality of pixels 10A. Although not illustrated in FIG. 3B, the counter electrode 12c has a connection with the accumulation control line 31 described above. During operation of the imaging device 100, by controlling the potential of the accumulation control line 31 to make the potential of the counter electrode 12c higher, for example, than that of the pixel electrode 12a, the positive charge, which is one of the positive and negative charges generated through photoelectric conversion, can be selectively collected by the pixel electrode 12a. By forming the counter electrode 12c in the form of a single layer that is continuous across the plurality of pixels 10A, a predetermined potential can be applied to the counter electrodes 12c of the plurality of pixels 10A in one go.

The pixel electrode 12a is an electrode made of a metal, such as aluminum or copper, a metal nitride, or polysilicon that has been given conductivity by being doped with impurities. The pixel electrode 12a is spatially separated from the pixel electrode 12a of a neighboring pixel 10A so as to be electrically separated from the pixel electrodes 12a of the other pixels 10A.

The conductive structure 89 includes a plurality of interconnecting wires, a plug pa1, and a contact plug cp1. One end of the conductive structure 89 is connected to the pixel electrode 12a. The plurality of interconnecting wires and the plugs pa1 are typically made of a metal, such as copper or tungsten, or a metal compound, such as a metal nitride or metal oxide. The contact plug cp1 is made of, for example, polysilicon doped with p-type impurities. The same applies to the other contact plugs (described below). As described below, by connecting the other end of the conductive structure 89 to a circuit element formed on the semiconductor substrate 60, the pixel electrode 12a of the photoelectric conversion structure 12 and the circuit on the semiconductor substrate 60 are electrically connected to each other.

The semiconductor substrate 60 is discussed below. As illustrated schematically in FIG. 3B, the semiconductor substrate 60 includes a support substrate 61 and at least one semiconductor layer formed on the support substrate 61. In FIG. 3B, the support substrate 61 that is a p-type silicon substrate is illustrated.

In the configuration illustrated in FIG. 3B, the semiconductor substrate 60 has a p-type semiconductor layer 61p on the support substrate 61, an n-type semiconductor layer 62n on the p-type semiconductor layer 61p, a p-type semiconductor layer 63p on the n-type semiconductor layer 62n, and a p-type semiconductor layer 65p serving as a first semiconductor layer located on the p-type semiconductor layer 63p.

Note that according to the present embodiment, n-type is referred to as a first conductivity type, and p-type is referred to as a second conductivity type. The p-type semiconductor layer 61p is an example of a first region that is located in the semiconductor substrate 60 and that contains impurities of the second conductivity type. In addition, the n-type semiconductor layer 62n is an example of a second region that covers the first region and contains impurities of the first conductivity type. Furthermore, the p-type semiconductor layer 65p and a p-type impurity region 66p (described below) form a well region located above the second region.

Typically, the p-type semiconductor layer 63p is formed over the entire surface of the support substrate 61. The p-type semiconductor layer 61p, the n-type semiconductor layer 62n, the p-type semiconductor layer 63p, and p-type semiconductor layer 65p are each typically formed by ion implantation of impurities into a semiconductor layer formed by epitaxial growth. The impurity concentration of the p-type semiconductor layer 65p is higher than that of the p-type semiconductor layer 61p.

The n-type semiconductor layer 62n serving as the second semiconductor layer is located between the p-type semiconductor layer 61p and the p-type semiconductor layer 63p. Although not illustrated in FIG. 3A, a well contact (not illustrated) is connected to the n-type semiconductor layer 62n. The well contact is provided outside the imaging region R1. During operation of the imaging device 100, the potential of the n-type semiconductor layer 62n is controlled via the well contact. By providing the n-type semiconductor layer 62n, minority carriers are blocked from entering a charge accumulation region, which accumulates signal charges, from the support substrate 61 or the peripheral circuits.

The semiconductor substrate 60 has a p-type region 64 provided between the p-type semiconductor layer 63p and the support substrate 61 so as to penetrate the p-type semiconductor layer 61p and the n-type semiconductor layer 62n. The p-type region 64 has a higher impurity concentration than the p-type semiconductor layer 63p and the p-type semiconductor layer 65p. The p-type region 64 electrically connects the p-type semiconductor layer 63p to the support substrate 61. The support substrate 61 has a connection with a substrate contact (not illustrated in FIG. 3B) provided outside the imaging region R1. During operation of the imaging device 100, the potential of the support substrate 61 and the potential of the p-type semiconductor layer 63p are controlled via the substrate contact. In addition, by arranging the p-type semiconductor layer 65p such that the p-type semiconductor layer 65p is in contact with the p-type semiconductor layer 63p, the potential of the p-type semiconductor layer 65p can be controlled via the p-type semiconductor layer 63p during operation of the imaging device 100.

In the configuration illustrated in FIG. 3B, the p-type semiconductor layer 65p has a p-type impurity region 66p having a lower concentration of impurities, and the p-type impurity region 66p has an n-type impurity region 67n formed therein. The n-type impurity region 67n is located inside the semiconductor substrate 60. The n-type impurity region 67n is electrically connected to the photoelectric conversion structure 12 and is an example of a first impurity region containing impurities of the first conductivity type. As schematically illustrated in FIG. 3B, the n-type impurity region 67n is formed in the vicinity of the surface of the semiconductor substrate 60, and at least part of the n-type impurity region 67n is located in the surface of the semiconductor substrate 60. In FIG. 3B, the n-type impurity region 67n includes a first region 67a and a second region 67b that is located within the first region 67a and that has a relatively higher impurity concentration than the first region 67a.

An insulating layer is disposed on the main surface of the semiconductor substrate 60 adjacent to the photoelectric conversion structure 12. In this example, the main surface of the semiconductor substrate 60 adjacent to the photoelectric conversion structure 12 is covered by a first insulating layer 70 and a second insulating layer 71. The first insulating layer 70 is, for example, a thermally oxidized film of silicon. The second insulating layer 71 is, for example, a silicon dioxide layer. The second insulating layer 71 may have a stacked structure including a plurality of insulating layers.

The first insulating layer 70 has a contact hole h1 therein, on the second region 67b of the n-type impurity region 67n. In the example illustrated in FIG. 3B, the contact plug cp1, which is part of the conductive structure 89, is connected to the second region 67b through the contact hole h1. Thus, the n-type impurity region 67n is electrically connected to the pixel electrode 12a of the photoelectric conversion structure 12 via the conductive structure 89.

The junction capacitance formed by the p-n junction between the p-type impurity region 66p serving as a p-well and the n-type impurity region 67n functions as a capacitance to accumulate at least part of the signal charge, so that the n-type impurity region 67n functions as a charge accumulation region that temporarily holds the signal charge. That is, the conductive structure 89 and the n-type impurity region 67n constitute at least part of the charge accumulation node FD described above.

As described above, by placing the p-type semiconductor layer 65p adjacent to the p-type semiconductor layer 63p, the potential of the p-type semiconductor layer 65p can be controlled via the p-type semiconductor layer 63p during operation of the imaging device 100. Such a structure allows a region having a relatively low impurity concentration to be placed around a portion where the contact plug cp1 having an electrical connection with the photoelectric conversion structure 12 is in contact with the semiconductor substrate 60. In this example, the first region 67a and the p-type impurity region 66p are disposed around the second region 67b of the n-type impurity region 67n. By placing the first region 67a having relatively low impurity concentration around the second region 67b, the electric field strength formed by the p-n junction between the n-type impurity region 67n and one of the p-type semiconductor layer 65p and the p-type impurity region 66p can be reduced. A reduction of the electric field strength formed by the p-n junction provides an effect that the leakage current caused by the electric field formed by the p-n junction is reduced.

Note that the formation of the second region 67b in the n-type impurity region 67n is not essential. However, relatively increasing the impurity concentration of the second region 67b, which is a connection region between the contact plug cp1 and the semiconductor substrate 60, has the effect of preventing the spread of a depletion layer around a region where the contact plug cp1 is in contact with the semiconductor substrate 60. Thus, it is possible to prevent that a charge unintentionally flows into and/or flows out of the n-type impurity region 67n serving as the charge accumulation region due to a crystal defect of the semiconductor substrate 60 at the interface between the contact plug cp1 and the semiconductor substrate 60 (i.e., due to the interface state). In addition, connecting the contact plug cp1 to the second region 67b having a relatively high impurity concentration has the effect of reducing the contact resistance.

In the semiconductor substrate 60, the signal detection circuit 14A described above is formed. The signal detection circuit 14A in the pixel 10A is electrically isolated from the signal detection circuits 14A in neighboring pixels 10A by placing an element isolation region 69 between every neighboring pixels 10A. The element isolation region 69 is, for example, a p-type impurity region.

In the signal detection circuit 14A, the reset transistor 26 includes the n-type impurity region 67n as one of the drain and source regions and an n-type impurity region 68an as the other of the drain and source regions. The reset transistor 26 further includes a gate electrode 26e on the first insulating layer 70, and a portion of the first insulating layer 70 located between the gate electrode 26e and the semiconductor substrate 60 functions as a gate insulating film of the reset transistor 26. The n-type impurity region 68an is formed in the p-type semiconductor layer 65p. The n-type impurity region 68an is connected to the feedback line 53 via the contact plug cp2.

In the p-type semiconductor layer 65p, n-type impurity regions 68bn, 68cn, and 68dn are further provided. The n-type impurity regions 68bn, 68cn, and 68dn are located in the semiconductor substrate 60 and contain impurities of the first conductivity type. The n-type impurity regions 68bn, 68cn, and 68dn are examples of second impurity regions that differ from the first impurity regions. Note that the impurity concentration of the n-type impurity regions 68an, 68bn, 68cn, and 68dn is higher than that of the first region 67a of the n-type impurity region 67n.

The signal detection transistor 22 includes an n-type impurity region 68bn, an n-type impurity region 68cn, and a gate electrode 22e on the first insulating layer 70. In this example, the gate electrode 22e is connected to a portion of the conductive structure 89 that connects the pixel electrode 12a and the contact plug cp1 to each other in the layer in which the address signal line 34, the reset signal line 36, and the like are located. That is, the conductive structure 89 further has an electrical connection with the gate electrode 22e.

A contact plug cp3 is connected to the n-type impurity region 68bn serving as the drain region through a contact hole h3. The above-described power supply line 32 serving as a source follower power supply is connected to the contact plug cp3.

As illustrated schematically in FIG. 3B, the n-type impurity region 68bn is disposed in the p-type semiconductor layer 65p away from the n-type impurity region 67n serving as the charge accumulation region. In this example, impurity regions 69pa and 69pb are interposed between the n-type impurity region 68bn and the n-type impurity region 67n. In this manner, the n-type impurity region 68bn is electrically isolated from the n-type impurity region 67n. Each of the impurity regions 69pa and 69pb is part of the element isolation region 69 described above and is typically a p-type impurity region. The impurity concentration of the impurity regions 69*pa* and 69*pb* is higher than the impurity concentration of the p-type semiconductor layer 65*p* and is, for example, in the range of about $5 \times 10^{17}$ cm$^{-3}$ to $1 \times 10^{19}$ cm$^{-3}$. As illustrated in FIG. 3B, as viewed in a cross section perpendicular to the main surface of the semiconductor substrate 60, the impurity regions 69*pa* and 69*pb* are formed in the p-type semiconductor layer 65*p* between the n-type impurity region 67*n* and the n-type impurity region 68*bn* so as to be isolated from each other.

Furthermore, a blocking structure 28 is disposed on the first insulating layer 70 in a region between the impurity region 69*pa* and the impurity region 69*pb*. The blocking structure 28 is a structure including a semiconductor layer cp5 and a p-type impurity region 28*a*. As illustrated in FIG. 3B, the semiconductor layer cp5 is covered by the stacked structure of the second insulating layer 71 and the third insulating layer 72. Note that in this example, the stacked structure of the second insulating layer 71 and the third insulating layer 72 further covers the gate electrode 26*e* of the reset transistor 26, the gate electrode 22*e*, and a gate electrode 24*e* (described below). The semiconductor layer cp5 passes through a contact hole h5 provided in the first insulating layer 70 and is connected to the p-type impurity region 28*a* in the semiconductor substrate 60.

In the configuration illustrated in FIG. 3A, the blocking structure 28 has a rectangular shape that extends parallel to the column direction of the pixels 10A. Note that in the example illustrated in FIG. 3A, the signal detection transistor 22 and the address transistor 24 are linearly disposed in the vertical direction in FIG. 3A. These drain and source regions are electrically isolated from the drain and source regions of the reset transistor 26 by the element isolation region 69 that includes the impurity regions 69*pa* and 69*pb* as part thereof.

Details of Blocking Structure

Referring back to FIG. 3B, the configuration of the blocking structure 28 is described in detail below.

As described above, the blocking structure 28 includes the p-type impurity region 28*a*, which is an example of a third impurity region. The p-type impurity region 28*a* is formed in the p-type semiconductor layer 65*p* by diffusing p-type impurities from the semiconductor layer cp5, which is polysilicon doped with p-type impurities. The p-type impurity region 28*a* is a highly concentrated p-type impurity region in the vicinity of the surface of the semiconductor substrate. Note that the semiconductor layer cp5 is located on the semiconductor substrate 60 and is electrically connected to the third impurity region. The semiconductor layer cp5 is an example of a first contact including a semiconductor containing impurities of the second conductivity type.

As described above, a relatively high voltage (about 3.3V) is applied to the n-type impurity region 68*bn*, which functions as the drain region of the signal detection transistor 22, during operation of the imaging device 100. According to a study conducted by the present inventors, when electrons are generated in the p-n junction formed between the drain region to which the high voltage is applied and its surrounding area, some of the electrons may flow into the charge accumulation region due to diffusion via the interface state of the element isolation region and the interface state of the silicon substrate surface. The leakage current caused by the inflow of such extra charges may cause degradation of the quality of a resultant image.

In contrast, in this example, the blocking structure 28 is disposed between the n-type impurity region 68*bn* serving as the drain region of the signal detection transistor 22 and the n-type impurity region 67*n* serving as the charge accumulation region that holds the signal charge. For this reason, for example, even if electrons that migrate from the n-type impurity region 68*bn* to the n-type impurity region 67*n* due to diffusion are generated, such electrons cannot reach the other n-type impurity region due to the potential barrier caused by the p-type impurity region 28*a* formed immediately below the semiconductor layer cp5 in the semiconductor substrate 60. Alternatively, the electrons may disappear by recombination with holes. That is, the migration of minority carriers to the n-type impurity region 67*n* is blocked by the p-type impurity region 28*a* formed immediately below the semiconductor layer cp5. As a result, the occurrence of leakage current due to mixing of minority carriers into the n-type impurity region 67*n* is prevented.

Figure 4A:
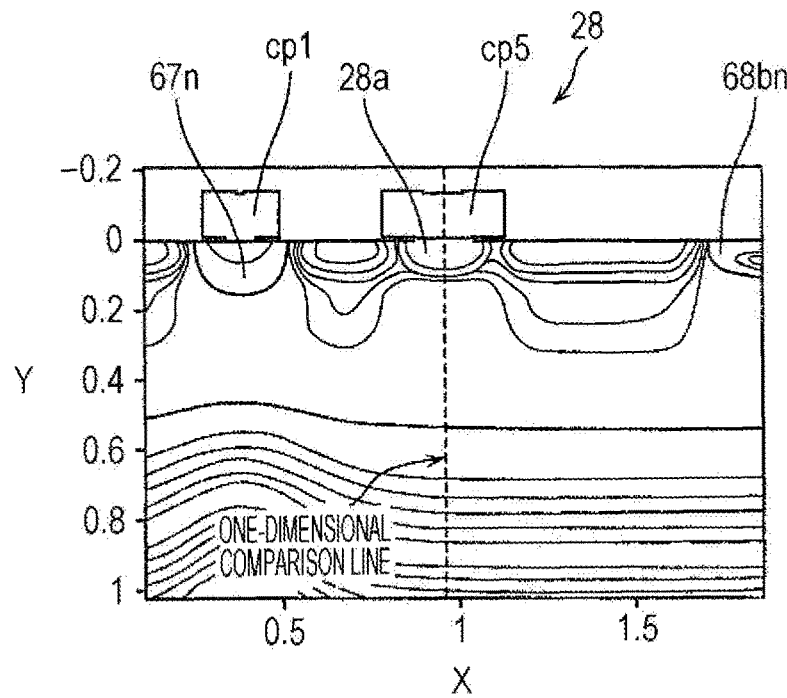
FIG. 4A illustrates the profile of impurity concentration in a region close to a blocking structure illustrated in FIG. 3B, which is obtained by simulation.
Figure 4B:
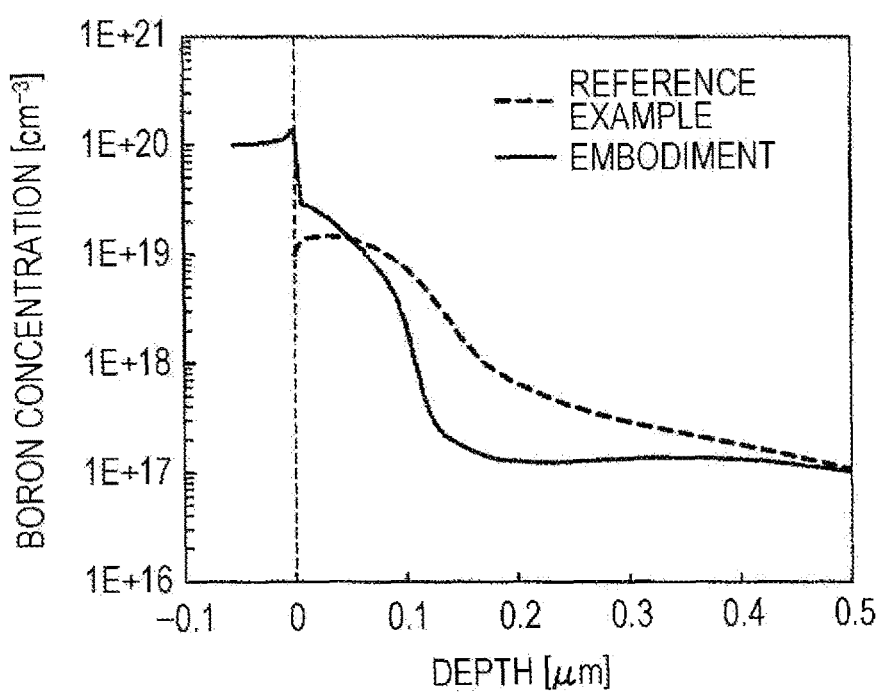
FIG. 4B illustrates the profile of impurity concentration in a region close to a blocking structure illustrated in FIG. 3B, which is obtained by simulation.

FIGS. 4A and 4B illustrate the profiles of impurity concentration in the region close to the blocking structure 28 illustrated in FIG. 3B, which is obtained by simulation. FIG. 4A illustrates the profile of impurity concentration in the cross-section of a region close to the blocking structure 28 illustrated in FIG. 3B. Note that in FIG. 4A, the positional relationship of the n-type impurity region 68*bn* and the n-type impurity region 67*n* to the blocking structure 28 is reversed from that in FIG. 3B. FIG. 4B illustrates the profile of impurity concentration in the depth direction of the semiconductor substrate 60 at a position indicated by a dashed line illustrated in FIG. 4A. Note that the profile according to the present embodiment and the profile according to the reference example are illustrated in FIG. 4B. In the reference example, an imaging device has only a p-type impurity region formed near the surface of the semiconductor substrate 60 as a blocking structure, instead of the blocking structure 28 according to the present embodiment.

As illustrated in FIG. 4B, according to the present embodiment, due to the presence of the p-type impurity region 28*a* formed immediately below the semiconductor layer cp5, the impurity concentration is maximized at the surface of the semiconductor substrate 60, and the impurity concentration decreases with increasing depth. In addition, the impurity concentration of the second conductivity type in the semiconductor layer cp5, which is the first contact, is higher than the impurity concentration of the second conductivity type in the portion of the p-type impurity region 28*a*, which is the third impurity region, below the surface of the semiconductor substrate 60. In contrast, according to the reference example, the impurity concentration is maximized at a position slightly deeper than the position of the surface of the semiconductor substrate 60, and the impurity concentration decreases with increasing depth beyond that position. The reason for such a difference is described below. That is, according to the present embodiment, the blocking structure 28 has a semiconductor layer cp5 made of polysilicon doped with a high concentration of p-type impurities, and the p-type impurity region 28*a* is formed by diffusion of p-type impurities from the semiconductor layer cp5 into the semiconductor substrate 60. In contrast, according to the reference example, the semiconductor layer cp5 is not provided, and the p-type impurity region is formed by ion implantation into the semiconductor substrate 60.

As described above, according to the present embodiment, the impurity concentration of the second conductivity type in the semiconductor layer cp5, which is the first contact, is higher than the impurity concentration of the second conductivity type in the portion of the p-type impurity region 28*a*, which is the third impurity region, below the surface of the semiconductor substrate 60. As a result, the leakage current due to the diffusion of electrons from the n-type impurity region 68bn to the n-type impurity region 67n via the interface state on the surface of the semiconductor substrate 60 is reduced more than in the reference example.

Figure 5:
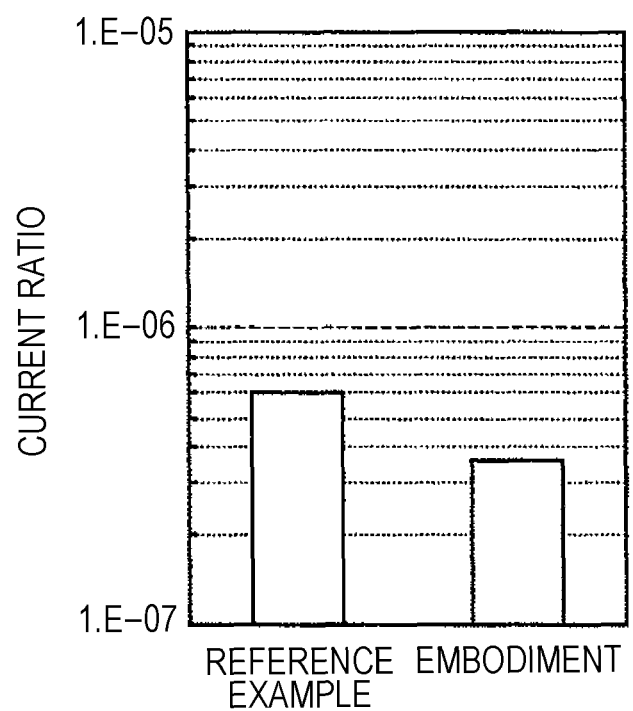
FIG. 5 illustrates a comparison of the magnitude of a leakage current according to the first embodiment with that according to a reference example.

FIG. 5 illustrates a comparison of the magnitude of the leakage current flowing from the n-type impurity region 68bn to the n-type impurity region 67n in the first embodiment with that in a reference example, which is obtained by simulation. More specifically, FIG. 5 illustrates the magnitudes of the leakage currents according to the present embodiment and the reference example when the n-type impurity region 68bn is relatively small. The ordinate represents an electric current ratio regarding the currents flowing through the n-type impurity region 67n. More specifically, the ordinate represents INQ/(INL+IGW+INQ), where INQ, INL, and IGW are the magnitudes of the current flowing through the n-type impurity region 67n, the current flowing through the n-type impurity region 68bn, and the current flowing through the n-type semiconductor layer 62n, respectively. According to the simulation, a voltage of 0.5 V is applied to the n-type impurity region 67n, a voltage of 3.3 V is applied to the n-type impurity region 68bn, a voltage of 0.5 V is applied to the n-type semiconductor layer 62n, and a voltage of 0 V is applied to the p-type semiconductor layer 61p. Note that the reference example illustrated in FIG. 5 is the same as the reference example described in FIG. 4B.

As can be seen from FIG. 5, according to the present embodiment in which the blocking structure 28 has a semiconductor layer cp5, the leakage current due to the diffusion of electrons into the n-type impurity region 67n is reduced, as compared with in the reference example. This is the case even when the n-type impurity region 68bn is relatively small or large.

FIGS. 6A and 6B illustrate an electron current distribution in a cross section of the semiconductor substrate 60 close to the blocking structure 28, which is obtained by simulation. More specifically, FIG. 6A illustrates the electron current distribution according to the reference example, and FIG. 6B illustrates the electron current distribution according to the present embodiment. Note that the reference example illustrated in FIG. 6A is the same as the reference example described in FIG. 4B. In FIGS. 6A and 6B, arrows indicate the path of electron diffusion from the n-type impurity region 68bn.

The electron current distribution from the n-type impurity region 68bn to the n-type impurity region 67n is discussed below. In the reference example illustrated in FIG. 6A, the distribution of a high value is seen in the region close to the n-type impurity region 67n, whereas in the present embodiment illustrated in FIG. 6B, the distribution of a significantly low value is seen in the region close to the n-type impurity region 67n. According to the present embodiment, it can be seen that the electronic current flowing from the n-type impurity region 68bn to the n-type impurity region 67n is reduced by the p-type impurity region 28a formed immediately below the semiconductor layer cp5.

First Modification of First Embodiment

Figure 7:
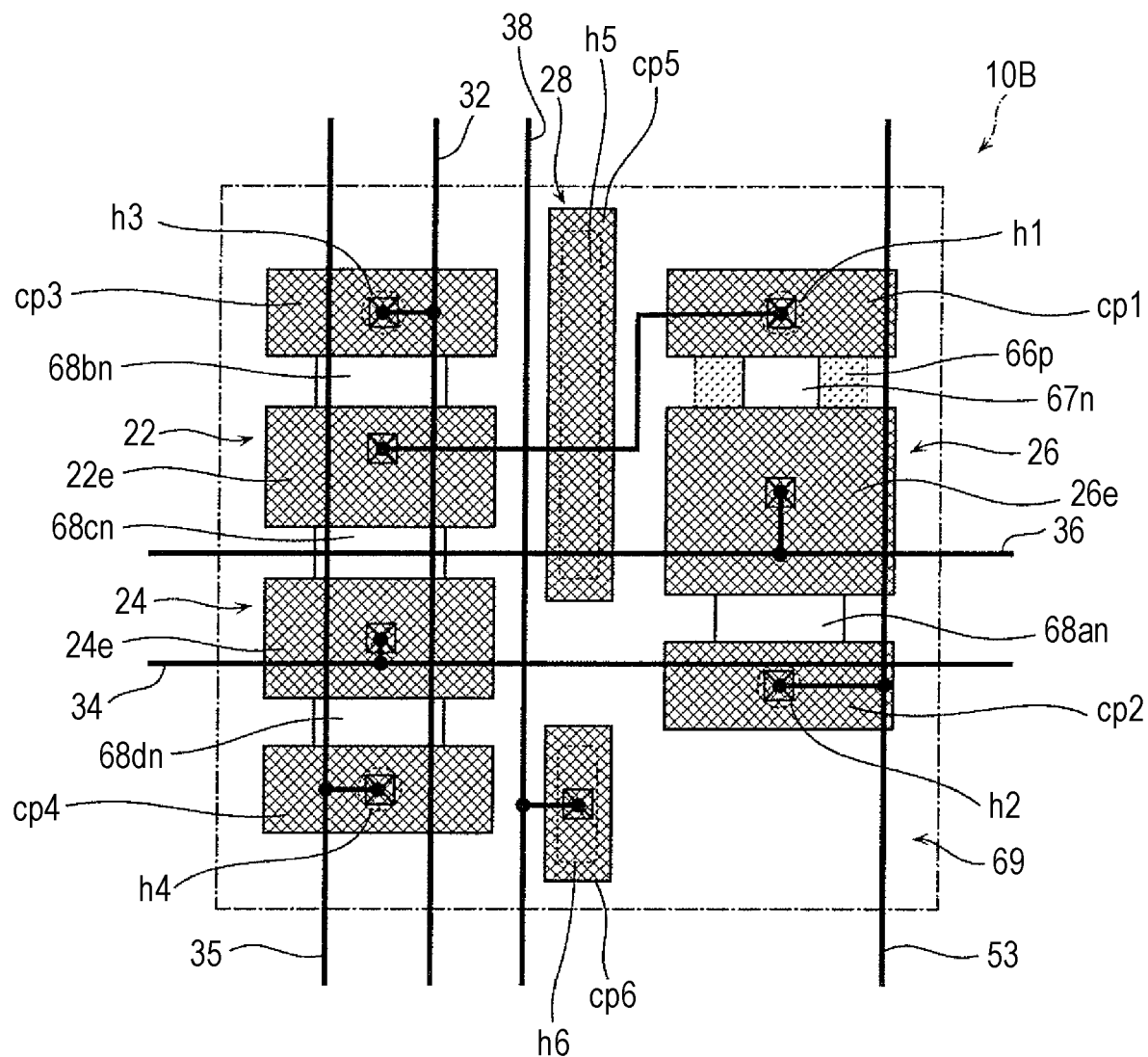
FIG. 7 is a plan view illustrating an example of the layout of the elements of a pixel according to a first modification of the first embodiment of the present disclosure.

FIG. 7 is a plan view illustrating an example of the layout of the elements of the pixel 10B according to a first modification of the first embodiment of the present disclosure. Unlike the first embodiment, according to the present modification, a semiconductor layer cp6 is provided in addition to the blocking structure 28. The semiconductor layer cp6 passes through a contact hole h6 and is electrically connected to the p-type semiconductor layer 65p, which is a p-type well. In addition, the semiconductor layer cp6 is connected to the voltage supply circuit 48 via the voltage line 38. By supplying a voltage from the voltage supply circuit 48 to the semiconductor layer cp6, the potential of the p-type semiconductor layer 65p can be controlled at a desired value. That is, the semiconductor layer cp6 can be used as a substrate contact. This eliminates the need to separately provide a substrate contact outside the imaging region to fix the potential of the support substrate 61, resulting in a reduction of the overall size of the imaging device.

Second Modification of First Embodiment

Figure 8A:
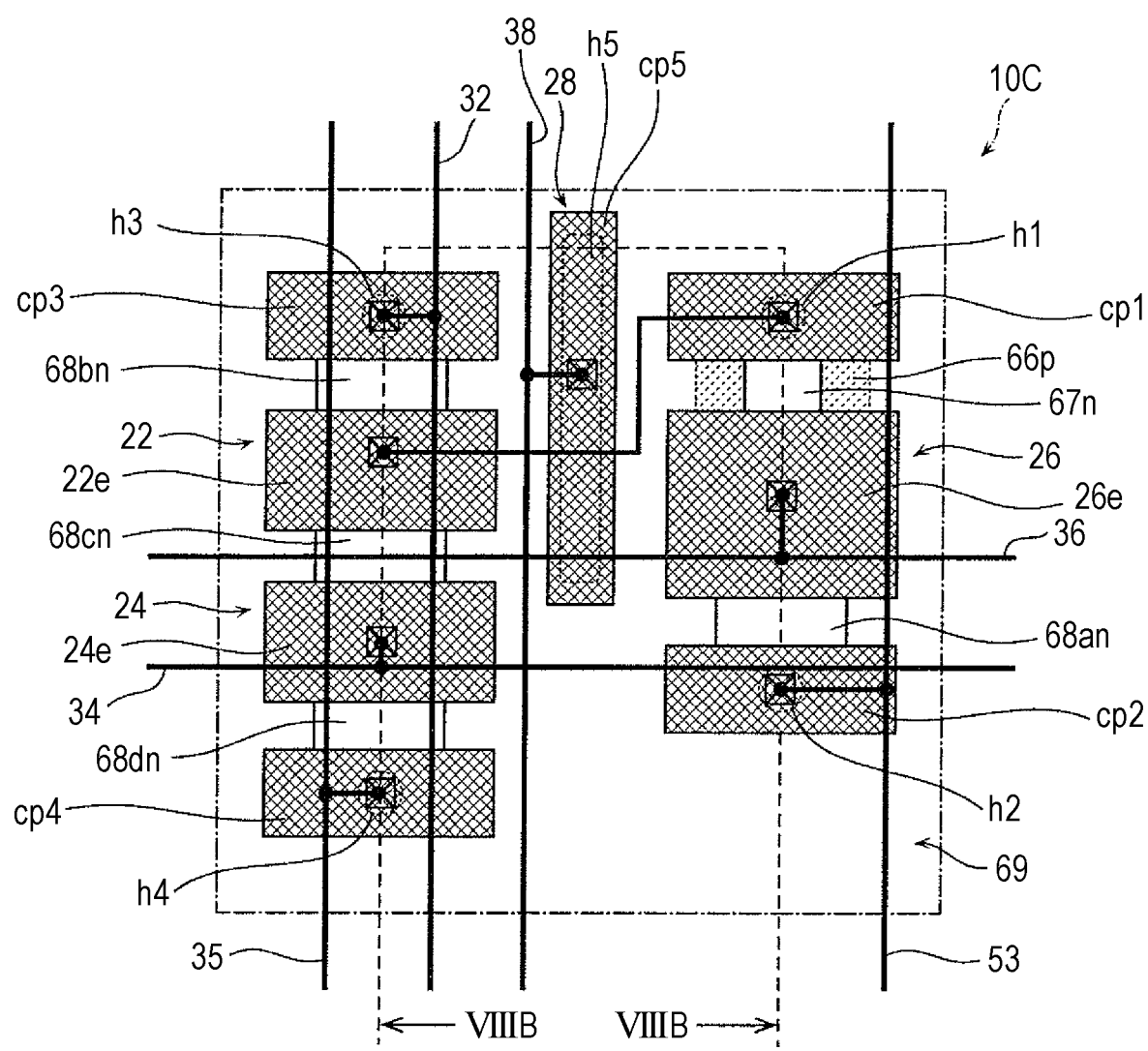
FIG. 8A is a plan view illustrating an example of the layout of the elements of a pixel according to a second modification of the first embodiment of the present disclosure.

FIG. 8A is a plan view illustrating an example of the layout of the elements of a pixel 10C according to a second modification of the first embodiment of the present disclosure. Unlike the first embodiment illustrated in FIG. 3A, the semiconductor layer cp5 is connected to the voltage supply circuit 48 via the voltage line 38. By supplying a voltage from the voltage supply circuit 48 to the semiconductor layer cp5, the potential of the p-type semiconductor layer 65p can be controlled at a desired value via the p-type impurity region 28a. That is, the blocking structure 28 can be used as a substrate contact.

Figure 8B:
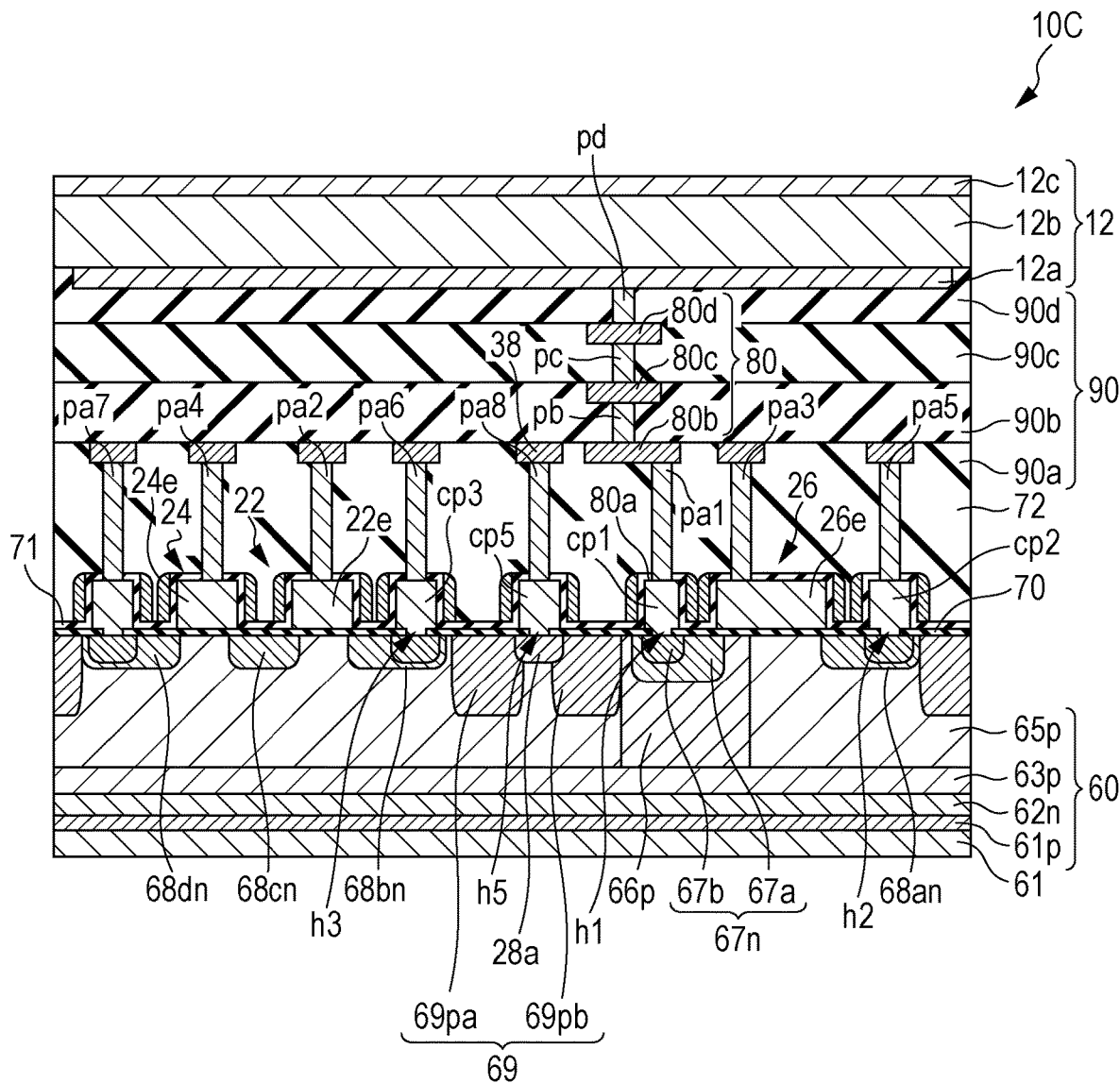
FIG. 8B is a schematic cross-sectional view of an exemplary configuration of a pixel according to the second modification of the first embodiment of the present disclosure.

FIG. 8B is a schematic cross-sectional view of an exemplary configuration of the pixel 10C. FIG. 8B is a developed cross-sectional view of the pixel 10C, taken along a line VIIIB-VIIIB in FIG. 8A. As illustrated in FIG. 8B, the semiconductor layer cp5 that constitutes the blocking structure 28 is connected to the voltage line 38 via a plug pa8. In addition, according to the present modification, the p-type semiconductor layer 61p is located in the semiconductor substrate 60 and is an example of a first region containing impurities of the second conductivity type. The n-type semiconductor layer 62n is an example of a second region that covers the entire surface over the first region and that contains impurities of the first conductivity type. Furthermore, the p-type semiconductor layer 65p and the p-type impurity region 66p are an example of a well region located above the second region. That is, according to the present modification, the p-type region 64 illustrated in FIG. 3B is not provided.

Due to such a structure, the blocking structure 28 can be used not only to reduce the leakage current to the n-type impurity region 67n but also to function as a substrate contact. As a result, according to the present modification, the size of the entire imaging device can be reduced, because the need for separately providing a substrate contact is eliminated to fix the potential of the support substrate 61, as can be seen from the absence of the p-type region 64 illustrated in FIG. 3B.

Third Modification of First Embodiment

Figure 9:
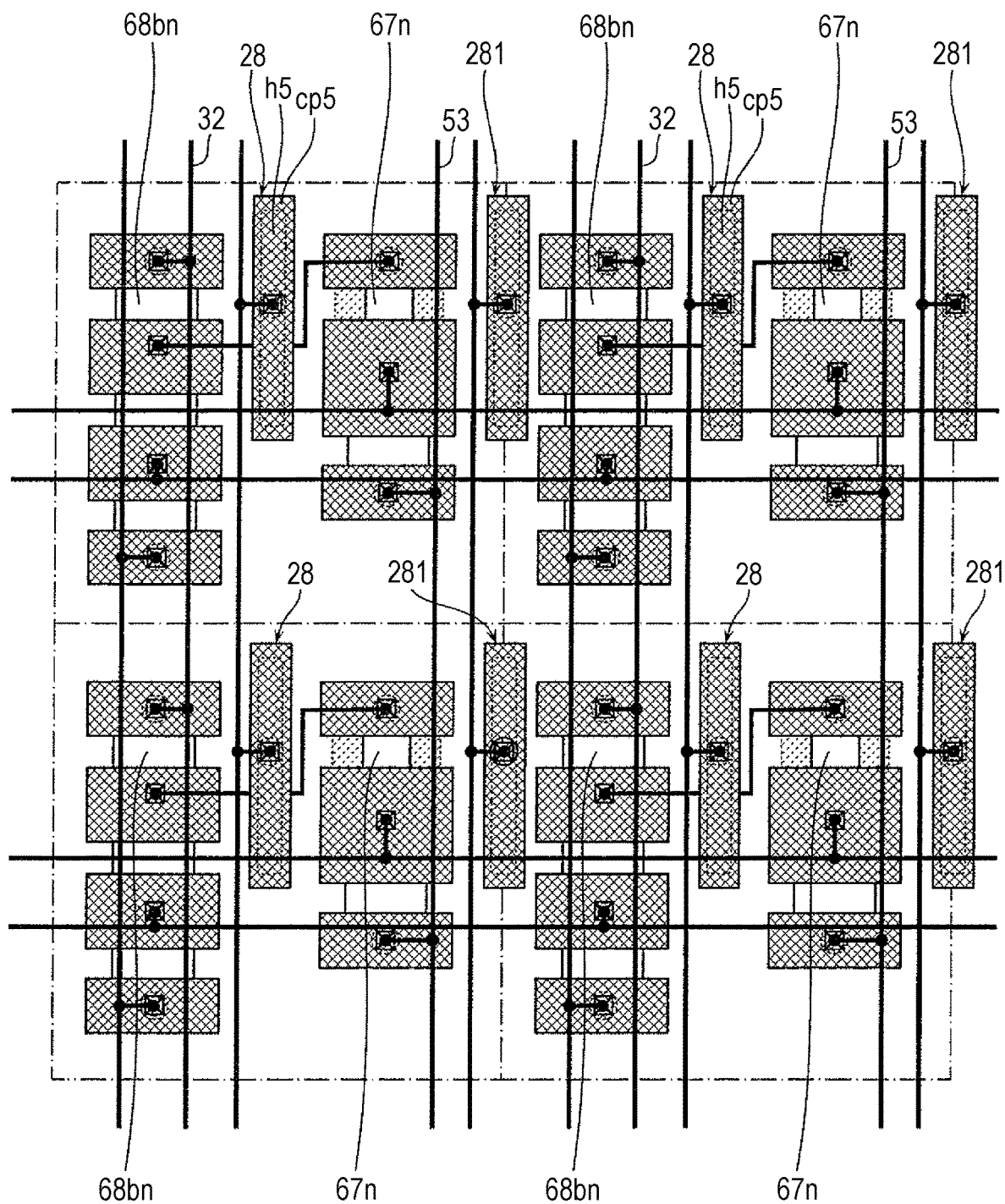
FIG. 9 is a plan view illustrating an example of the layout of the elements of a pixel according to a third modification of the first embodiment of the present disclosure.

FIG. 9 is a plan view illustrating an example of the layout of the elements in a pixel according to a third modification of the first embodiment of the present disclosure. According to the present modification, in plan view, blocking structures 28 and 281 are formed on the left and right sides of the n-type impurity region 67n (a charge accumulation region), respectively. That is, according to the above-described embodiment, the blocking structure 28 is provided only between the n-type impurity region 67n and the n-type impurity region 68bn of each pixel. However, according to the present modification, a blocking structure 281 is further provided between the n-type impurity region 67n of a first pixel and the n-type impurity region 68bn of a second pixel that neighbors the first pixel. The blocking structure 281 is provided, for example, on the boundary between the first pixel and the second pixel.

The blocking structure 281 has the same structure as the blocking structure 28. That is, the blocking structure 281 is a structure that includes the semiconductor layer cp5 and the p-type impurity region 28a. The semiconductor layer cp5 that constitutes the blocking structure 281 is covered by the stacked structure of the second insulating layer 71 and the third insulating layer 72. The semiconductor layer cp5 is connected to the semiconductor substrate 60 through the contact hole h5 provided in the first insulating layer 70. In addition, the highly concentrated p-type impurity region 28a is formed in the p-type semiconductor layer 65p immediately below the semiconductor layer cp5 that constitutes the blocking structure 281.

Note that the n-type impurity region 68bn in the second pixel is an example of a fourth impurity region that is located in the semiconductor substrate 60 and that contains impurities of the first conductivity type in the second pixel. The p-type impurity region 28a located immediately below the semiconductor layer cp5 that constitutes the blocking structure 281 is an example of a fifth impurity region that is located in the semiconductor substrate 60 and is located between the first impurity region and the fourth impurity region in plan view and that contains impurities of the second conductivity type. The semiconductor layer cp5 that constitutes the blocking structure 281 is an example of a second contact that is located on the semiconductor substrate 60 and is electrically connected to the fifth impurity region and that includes a semiconductor containing impurities of the second conductivity type.

According to the present modification, it is possible to reduce not only the leakage current that may occur within a pixel but also the leakage current caused by mixing of minority carriers from neighboring pixels.

Fourth Modification of First Embodiment

Figure 10A:
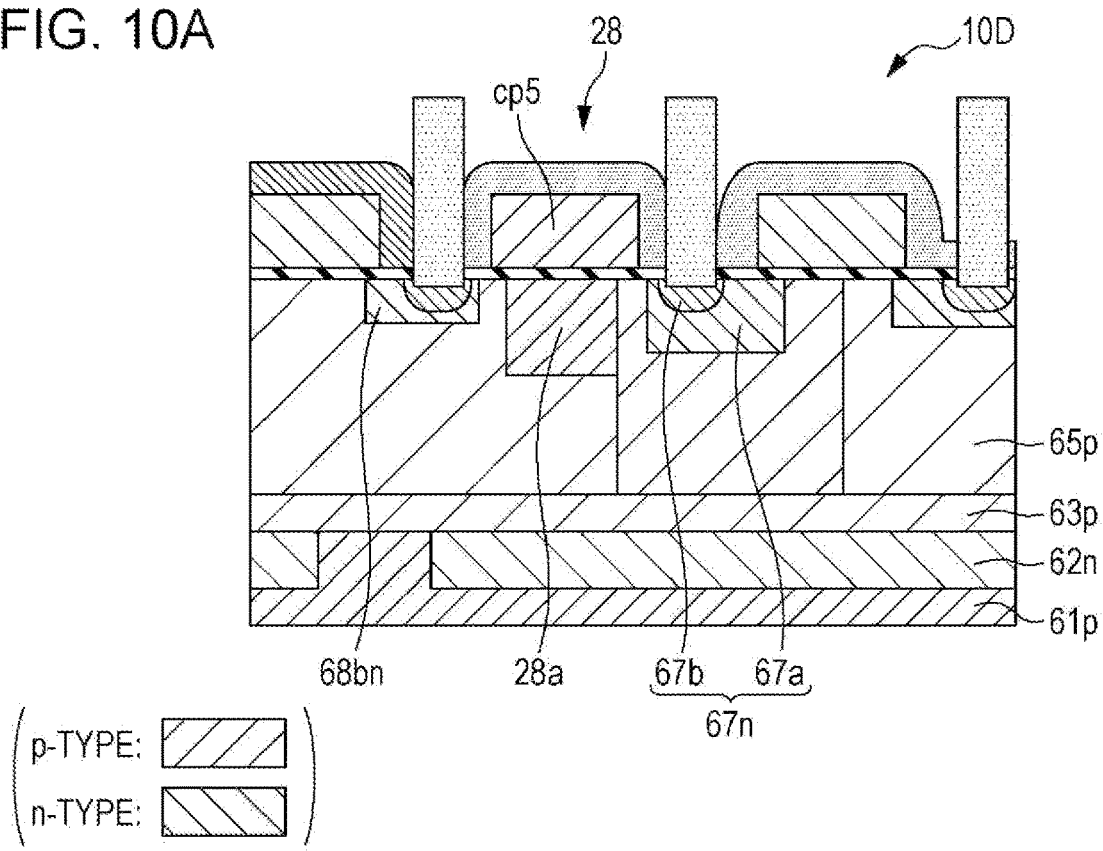
FIG. 10A is a schematic cross-sectional view of an exemplary configuration of a pixel according to a fourth modification of the first embodiment of the present disclosure.
Figure 10B:
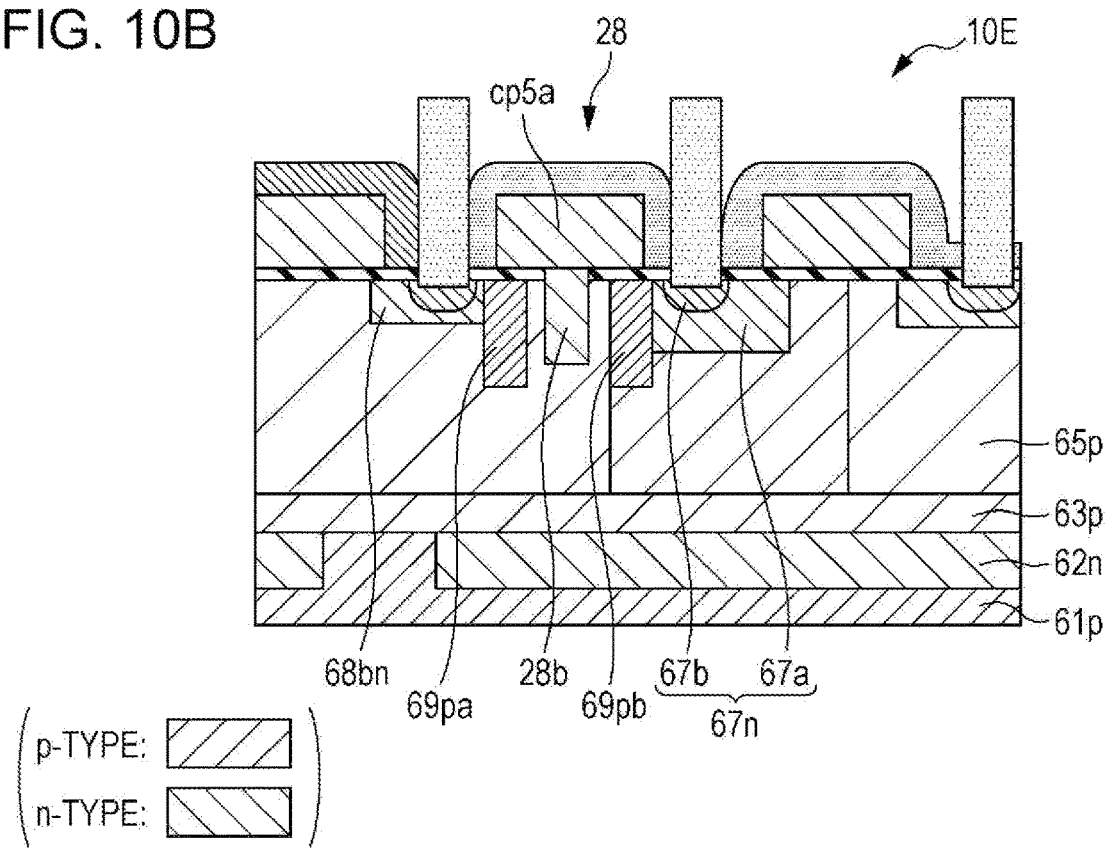
FIG. 10B is a schematic cross-sectional view of an exemplary configuration of a pixel according to the fourth modification of the first embodiment of the present disclosure.

FIG. 10A is a schematic cross-sectional view of an exemplary configuration of a pixel 10D according to a fourth modification of the first embodiment of the present disclosure. FIG. 10B is a schematic cross-sectional view of an exemplary configuration of a pixel 10E according to the fourth modification of the first embodiment of the present disclosure. Note that in FIGS. 10A and 10B, a right-upward shaded (hatched) region indicates that the region contains p-type impurities, and a right-downward shaded (hatched) region indicates that the region contains n-type impurities.

Unlike the first embodiment, the pixel 10D illustrated in FIG. 10A does not have the element isolation region 69 between the n-type impurity region 67n and the n-type impurity region 68bn. The p-type impurity region 28a contains p-type impurities having a polarity that is opposite to the polarity of the conductivity type of the n-type impurity region 67n and the n-type impurity region 68bn. For this reason, the p-type impurity region 28a can have not only the function of reducing the leakage current to the charge accumulation region but a function of serving as the element isolation region. This eliminates the need for additionally providing an element isolation region and, thus, the number and amount of impurity implantations into the semiconductor substrate can be reduced. As a result, damage to the semiconductor substrate caused by impurity implantation can be reduced.

Unlike the first embodiment, in the pixel 10E illustrated in FIG. 10B, the semiconductor layer cp5a that constitutes the blocking structure 28 includes a semiconductor containing n-type impurities, which is of the same polarity as the conductivity type of the n-type impurity region 67n and the n-type impurity region 68bn. In addition, the n-type impurity region 28b contains n-type impurities. Note that in this example, as in the first embodiment, the p-type impurity regions 69pa and 69pb are formed as element isolation regions.

That is, in pixel 10E, the n-type impurity region 67n is an example of a first impurity region that is located in the semiconductor substrate 60 and is electrically connected to the photoelectric conversion structure 12 and that contains impurities of the first conductivity type. The n-type impurity region 68bn is an example of a second impurity region that is located in the semiconductor substrate 60, that contains impurities of the first conductivity type, and that differs from the first impurity region. The n-type impurity region 28b is an example of a sixth impurity region that is located in the semiconductor substrate 60 and is located between the first impurity region and the second impurity region in plan view and that contains impurities of the first conductivity type. The semiconductor layer cp5a is an example of a third contact that is located on the semiconductor substrate 60 and is electrically connected to the sixth impurity region and that includes a semiconductor containing impurities of the first conductivity type. Each of the p-type impurity regions 69pa and 69pb that constitute the element isolation region is an example of a seventh impurity region that is located in the semiconductor substrate 60 and that contains impurities of the second conductivity type that differs from the first conductivity type. The p-type impurity region 69pa is located between the second impurity region and the sixth impurity region in plan view, and the p-type impurity region 69pb is located between the first impurity region and the sixth impurity region in plan view. Due to the presence of the p-type impurity regions 69pa and 69pb that constitute the element isolation regions, the n-type impurity region 28b formed immediately below the semiconductor layer cp5a is electrically isolated from the n-type impurity region 67n and the n-type impurity region 68bn. In addition, the n-type impurity region 28b absorbs unnecessary charges that move toward the n-type impurity region 67n. As a result, even a blocking structure having such structure can reduce the leakage current to the n-type impurity region 67n.

Second Embodiment

Figure 11:
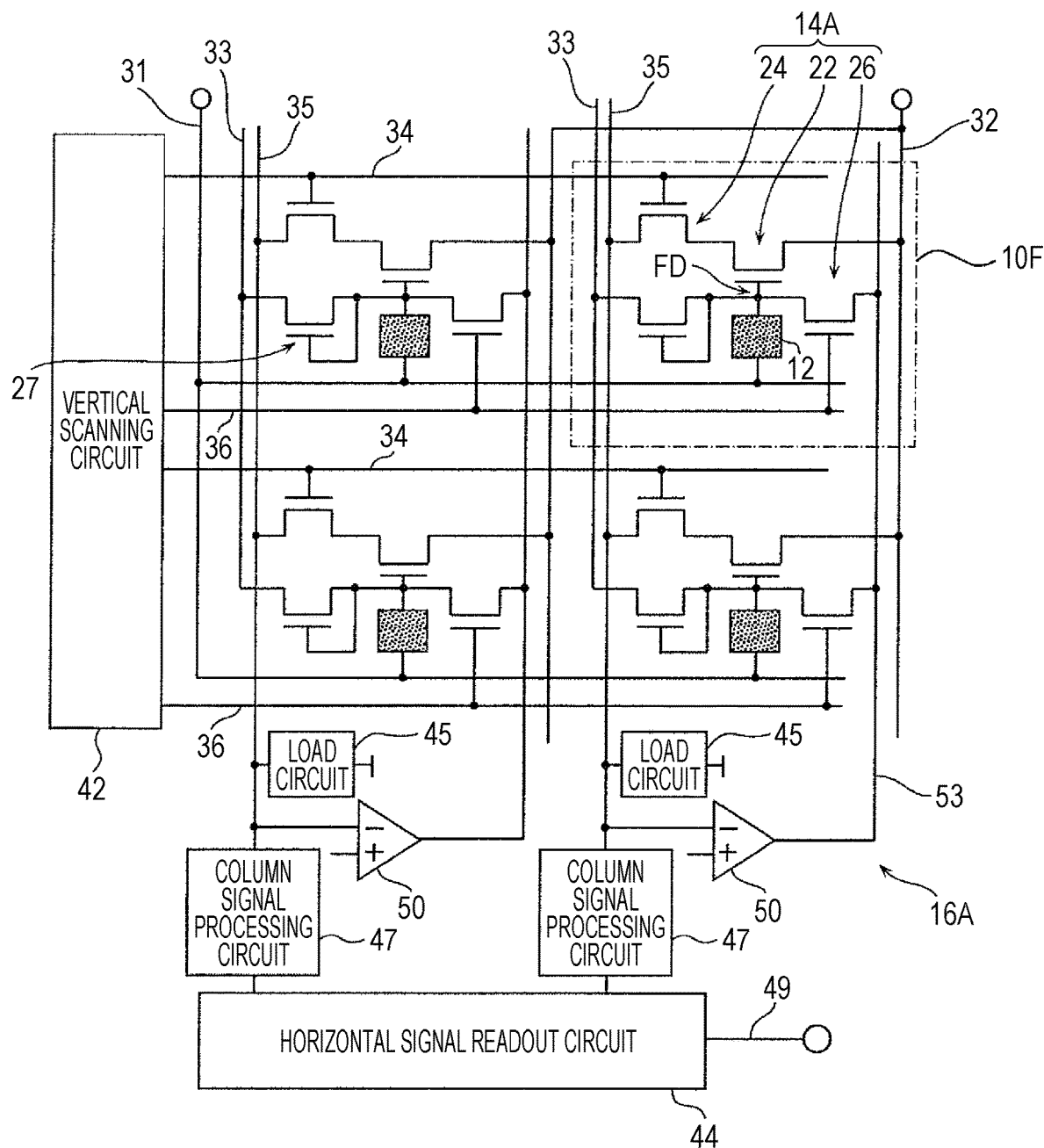
FIG. 11 illustrates an exemplary circuit configuration of an imaging device according to a second embodiment of the present disclosure.

FIG. 11 illustrates an exemplary circuit configuration of an imaging device according to a second embodiment of the present disclosure. The second embodiment primarily differs from the first embodiment in that each of pixels 10F includes an OF transistor 27. The OF transistor 27 performs an overflow operation to release a charge in order to prevent an excessive potential rise of the charge accumulation region. One of the drain and the source of the OF transistor 27 is connected to the gate of the OF transistor 27 and is further connected to the charge accumulation node FD. The other of the drain and the source of the OF transistor 27 is connected to a power supply line 33. As a result, if excess charge is accumulated in the charge accumulation node FD, the excess charge is discharged to the power supply line 33 via the OF transistor 27. In this manner, excessive potential rise of the charge accumulation node FD is prevented. As a result, blooming is prevented. Note that the term "blooming" is used to describe a phenomenon in which charges generated by strong incident light having the saturation level or greater overflow into a neighboring pixel.

Figure 12:
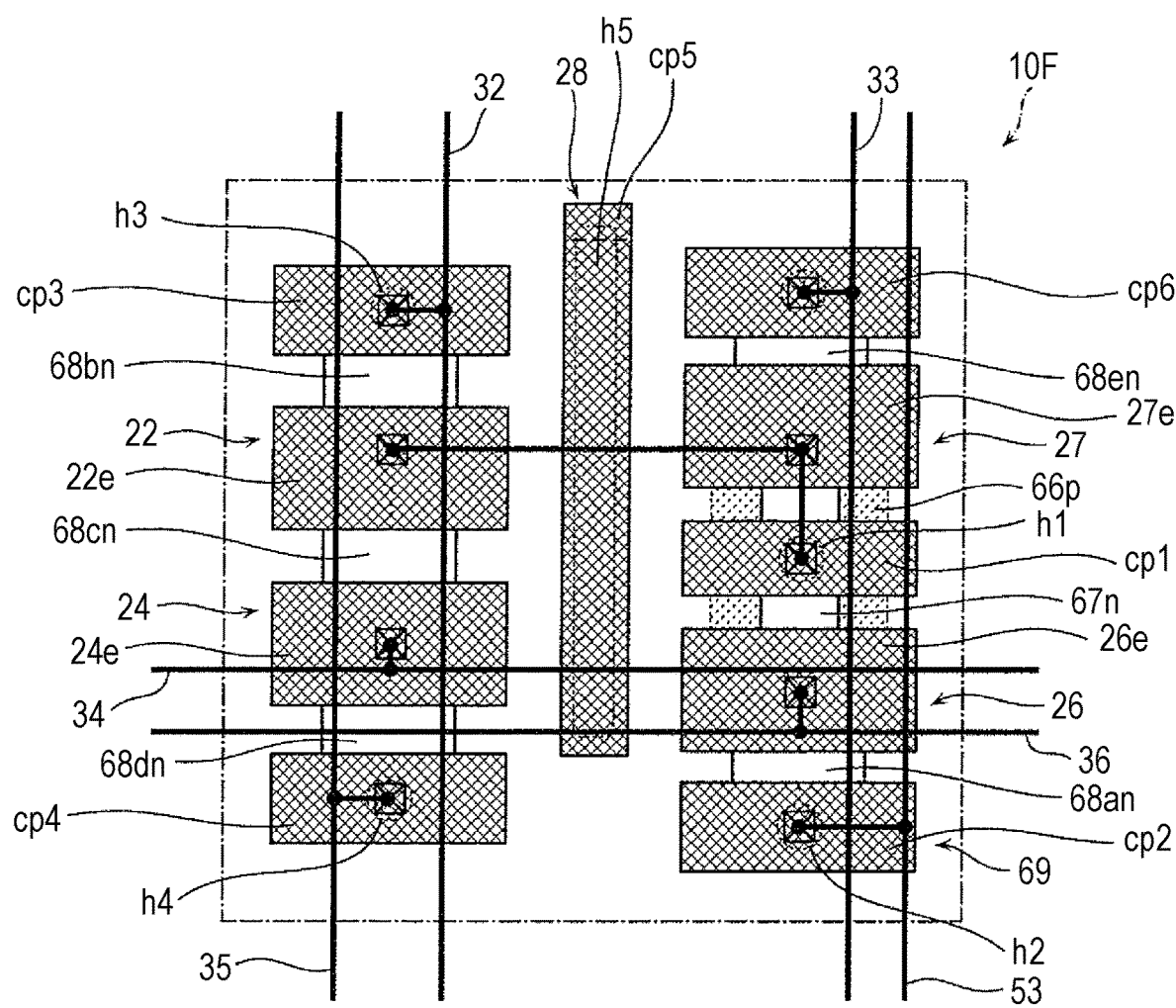
FIG. 12 is a plan view illustrating an example of the layout of the elements in a pixel according to the second embodiment of the present disclosure.

FIG. 12 is a plan view illustrating an example of the layout of the elements of the pixel 10F according to the second embodiment of the present disclosure. Unlike the first embodiment illustrated in FIG. 3A, according to the second embodiment, the OF transistor 27 and the power supply line 33 are additionally provided. The OF transistor 27 has a gate electrode 27e and an n-type impurity region 68en as a source region. In addition, the OF transistor 27 shares the n-type impurity region 67n with the reset transistor 26. The n-type impurity region 68en is connected to the power supply line 33 via the semiconductor layer cp6.

Third Embodiment

Figure 13:
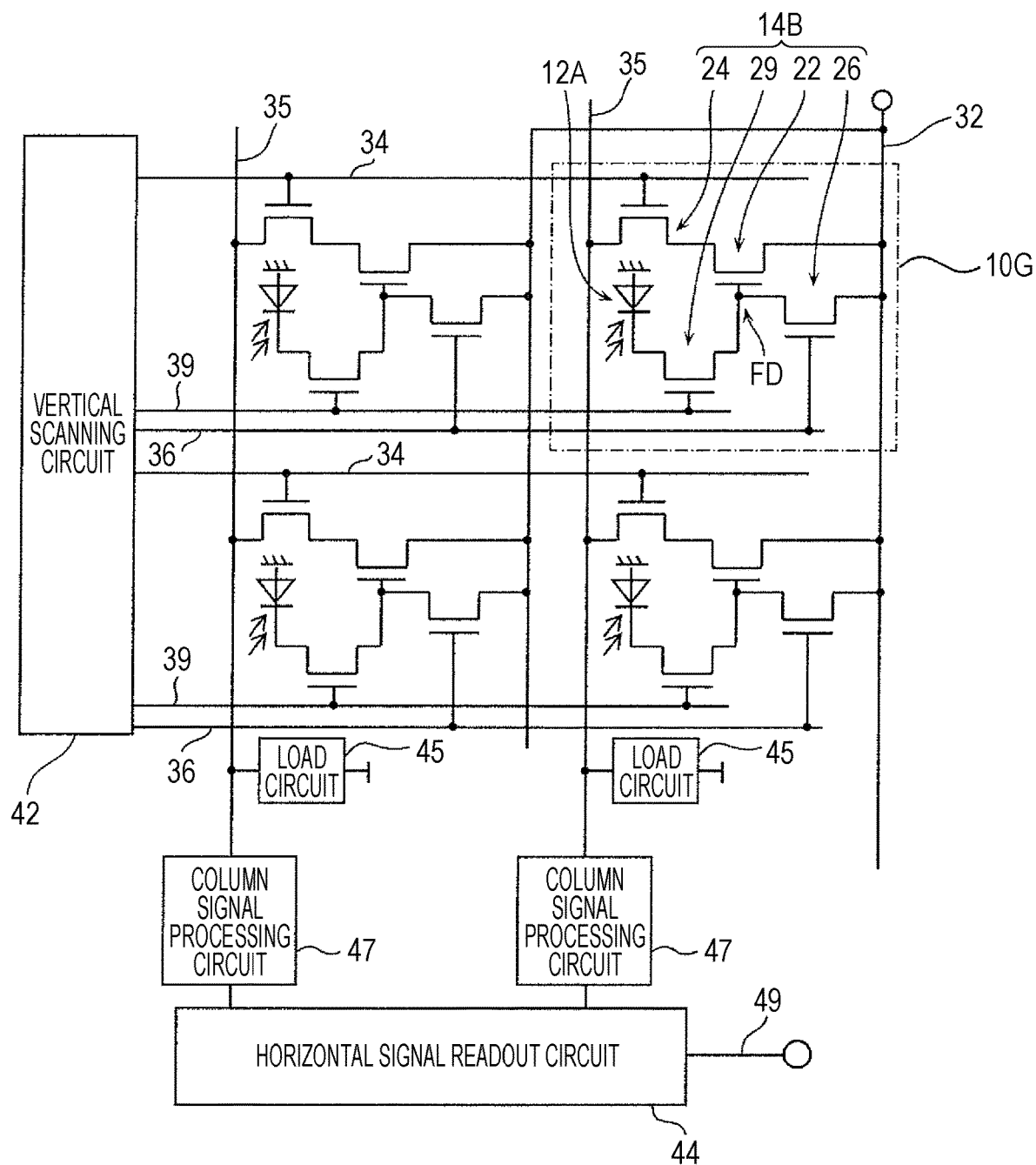
FIG. 13 illustrates an exemplary circuit configuration of an imaging device according to a third embodiment of the present disclosure.

FIG. 13 illustrates an exemplary configuration of an imaging device according to a third embodiment of the present disclosure. The third embodiment primarily differs from the first embodiment in that each of pixels 10G includes, as the photoelectric conversion structure 12A, a photodiode formed in a semiconductor substrate. In addition, unlike the first embodiment, a signal detection circuit 14B includes a transfer transistor 29 for transferring the charge generated by the photodiode to the charge accumulation node FD.

Figure 14:
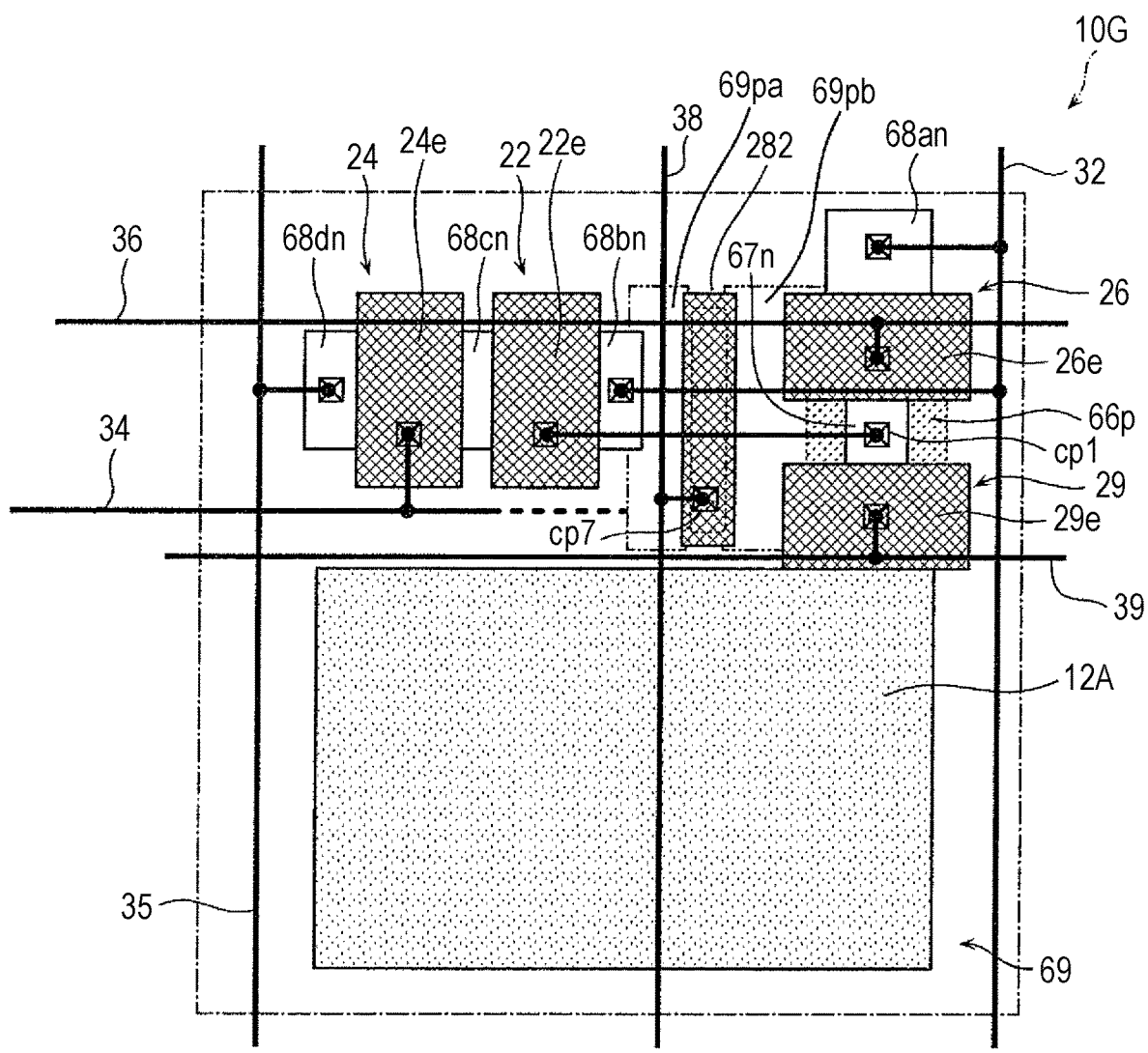
FIG. 14 is a plan view illustrating an example of the layout of the elements in a pixel according to the third embodiment of the present disclosure.

FIG. 14 is a plan view illustrating an example of the layout of the elements of a pixel 10G. According to the third embodiment, the charge generated in the photoelectric conversion structure 12A is transferred to the n-type impurity region 67n by the transfer transistor 29 having a gate electrode 29e. Like the first embodiment, a blocking structure 282 similar to that in the first embodiment is provided between the n-type impurity region 67n and the n-type impurity region 68bn. The blocking structure 282 includes a semiconductor layer cp7 electrically connected to the p-type semiconductor layer 65p, which is a p-type well. In addition, like the second modification of the first embodiment, the semiconductor layer cp7 is connected to the voltage supply circuit 48 via the voltage line 38.

The blocking structure 282 can provide the same effect as in the first embodiment even in an imaging device having a photodiode in a semiconductor substrate. Furthermore, like the second modification of the first embodiment, the blocking structure 282 can be used as a substrate contact.

As described above, according to the embodiments and modifications of the present disclosure, the impact of leakage current can be reduced and, thus, an imaging device that can capture a high-quality image can be provided.

While the imaging devices of the present disclosure have been described with reference to the embodiments and modifications, the present disclosure is not limited thereto. Embodiments and modifications to which various modifications that those skilled in the art conceive are applied and other embodiments formed by combining some constituent elements of the embodiments and modifications without departing from the inventive concepts of the present disclosure are encompassed within the scope of the disclosure. In addition, each of the above embodiments and modifications may be subjected to modification, replacement, addition, and omission in various ways within the scope of the claims or equivalents thereof.

For example, each of the signal detection transistor 22, the address transistor 24, and the reset transistor 26 described above may be an N-channel MOSFET or a P-channel MOSFET. In addition, these transistors need not be all N-channel MOSFETs or P-channel MOSFETs. If each of the transistors in a pixel is an N-channel MOSFET to use electrons as a signal charge, the source and drain in each of the transistors can be swapped.

In addition, while the above embodiments and modifications have been described with reference to the blocking structure provided between the n-type impurity region 68bn and the n-type impurity region 67n in the plan view, the position of the blocking structure is not limited thereto. The blocking structure may be disposed between the n-type impurity region 67n and any one of impurity regions that can be carrier generation regions. Thus, the blocking structure can be provided in each of many paths that can flow into the charge accumulation region, resulting in a more decrease in leakage current flowing into the charge accumulation region.

In addition, while the above embodiments and modifications have been described with reference to the semiconductor layer of the blocking structure being a straight rectangular region in plan view, the shape is not limited thereto. The shape may be another shape, such as an L shape. Alternatively, the shape may be a shape that extends longer than in the above embodiments and modifications. As a result, a blocking structure can be provided in each of many paths that can flow into the charge accumulation region, resulting in a more decrease in leakage current flowing into the charge accumulation region.

According to the embodiments of the present disclosure, an imaging device is provided that is capable of capturing high-quality images by reducing the influence of a leakage current. The imaging device according to the present disclosure is useful for, for example, image sensors, digital cameras, and the like. The imaging device according to the present disclosure can be used in a medical camera, a robot camera, a security camera, an in-vehicle camera, and the like.

What is claimed is:
1. An imaging device comprising:
a semiconductor substrate;
a photoelectric converter that converts incident light into a charge;
a first impurity region located in the semiconductor substrate, the first impurity region accumulating the charge, the first impurity region containing impurities of a first conductivity type;
a second impurity region located in the semiconductor substrate, the second impurity region containing impurities of the first conductivity type, the second impurity region being different from the first impurity region;
a third impurity region located in the semiconductor substrate, between the first impurity region and the second impurity region in plan view, the third impurity region containing impurities of a second conductivity type that differs from the first conductivity type;
a first contact located on the semiconductor substrate, between the first impurity region and the second impurity region in the plan view, the first contact being electrically connected to the third impurity region, the first contact including a semiconductor containing impurities of the second conductivity type; and
a first pixel,
wherein the first pixel includes the first impurity region and the second impurity region.

2. The imaging device according to claim 1, wherein an impurity concentration of the second conductivity type in the first contact is higher than an impurity concentration of the second conductivity type in a portion of the third impurity region located below a surface of the semiconductor substrate.

3. The imaging device according to claim 1, further comprising:
   a voltage supply circuit that supplies a voltage to the first contact; and
   a well region located in the semiconductor substrate, the well region containing impurities of the second conductivity type,
   wherein the first impurity region, the second impurity region, and the third impurity region are located in the well region.

4. The imaging device according to claim 1,
   wherein the first pixel further includes the third impurity region and the first contact.

5. The imaging device according to claim 1, further comprising:
   a second pixel that differs from the first pixel, wherein:
   the first pixel further includes the third impurity region and the first contact,
   the second pixel includes a fourth impurity region, a fifth impurity region, and a second contact,
   the fourth impurity region is located in the semiconductor substrate and contains impurities of the first conductivity type,
   the fifth impurity region is located in the semiconductor substrate, between the first impurity region and the fourth impurity region in the plan view, and the fifth impurity region contains impurities of the second conductivity type, and
   the second contact is located on the semiconductor substrate and is electrically connected to the fifth impurity region, and the second contact includes a semiconductor containing impurities of the second conductivity type.

6. The imaging device according to claim 1, wherein the third impurity region electrically isolates the first impurity region from the second impurity region, so as to suppress a leakage current between the second impurity region and the first impurity region.

7. The imaging device according to claim 1, further comprising:
   a first transistor having the second impurity region as one of a source and a drain of the first transistor,
   wherein the first transistor detects a signal in accordance with a potential of the first impurity region.

8. The imaging device according to claim 7, wherein the first transistor includes a gate electrode electrically connected to the first impurity region.

9. The imaging device according to claim 7, wherein the third impurity region is disposed between the first impurity region and the first transistor in the plan view.

10. The imaging device according to claim 7, further comprising:
    a second transistor having the first impurity region as one of a source and a drain of the second transistor,
    wherein the third impurity region is disposed between a gate electrode of the second transistor and the first transistor in the plan view.

11. The imaging device according to claim 1, wherein the third impurity region is in contact with a surface of the semiconductor substrate.

12. The imaging device according to claim 1, wherein:
    the photoelectric converter is located above the semiconductor substrate, and
    the photoelectric converter and the first impurity region are connected by one or more contact plugs.

13. The imaging device according to claim 1, wherein the first contact is connected to the third impurity region via a contact hole formed in an insulating layer disposed over the semiconductor substrate.

14. The imaging device according to claim 1, wherein the first contact is made of a doped polysilicon.

15. The imaging device according to claim 1, further comprising a plurality of pixels arranged in matrix along a column direction and a row direction,
    wherein the first contact has a rectangular shape that extends parallel to the column direction.

16. The imaging device according to claim 1, wherein the third impurity region is not in direct contact with the first impurity region.

17. The imaging device according to claim 1, wherein:
    a portion of the third impurity region is located on a surface of the semiconductor substrate, and
    the first contact is in direct contact with the portion of the third impurity region.

18. The imaging device according to claim 1, wherein a level of an uppermost surface of the third impurity region is the same as a level of an uppermost surface of the first impurity region.

19. The imaging device according to claim 1, wherein a lowermost surface of the first contact entirely overlaps with the third impurity region in the plan view.

* * * * *